United States Patent
Uemura et al.

(10) Patent No.: US 10,436,842 B2
(45) Date of Patent: Oct. 8, 2019

(54) TERMINAL APPARATUS, BASE STATION APPARATUS, COMMUNICATION METHOD, AND INTEGRATED CIRCUIT

(71) Applicant: Sharp Kabushiki Kaisha, Sakai, Osaka (JP)

(72) Inventors: Katsunari Uemura, Sakai (JP); Shohei Yamada, Sakai (JP); Hidekazu Tsuboi, Sakai (JP)

(73) Assignee: Sharp Kabushiki Kaisha, Sakai (JP)

( * ) Notice: Subject to any disclaimer, the term of this patent is extended or adjusted under 35 U.S.C. 154(b) by 84 days.

(21) Appl. No.: 15/512,098

(22) PCT Filed: Jul. 23, 2015

(86) PCT No.: PCT/JP2015/071018
§ 371 (c)(1),
(2) Date: Mar. 17, 2017

(87) PCT Pub. No.: WO2016/047261
PCT Pub. Date: Mar. 31, 2016

(65) Prior Publication Data
US 2017/0285105 A1    Oct. 5, 2017

(30) Foreign Application Priority Data

Sep. 24, 2014 (JP) ................................. 2014-193254

(51) Int. Cl.
*H04W 72/04* (2009.01)
*H04W 28/06* (2009.01)
(Continued)

(52) U.S. Cl.
CPC .... *G01R 31/31903* (2013.01); *G06F 11/3656* (2013.01); *H04B 7/061* (2013.01);
(Continued)

(58) Field of Classification Search
CPC ............. H04W 56/00; H04W 72/0446; H04W 72/1289; H04W 76/14; H04W 8/005;
(Continued)

(56) References Cited

U.S. PATENT DOCUMENTS

2015/0271763 A1* 9/2015 Balachandran ........ H04B 17/18
                                                              370/338
2015/0271861 A1* 9/2015 Li ....................... H04W 56/001
                                                              455/426.1
(Continued)

FOREIGN PATENT DOCUMENTS

EP       2 943 033 A1     11/2015
WO    2015/142113 A1      9/2015

OTHER PUBLICATIONS

Official Communication issued in International Patent Application No. PCT/JP2015/071018, dated Oct. 13, 2015.
(Continued)

*Primary Examiner* — Un C Cho
*Assistant Examiner* — Peter K Mak
(74) *Attorney, Agent, or Firm* — Keating & Bennett, LLP

(57) ABSTRACT

Provided is a technique related to a terminal apparatus, a base station apparatus, a communication system, a communication method, and an integrated circuit that are capable of efficiently performing device-to-device communication. In a case where a terminal apparatus capable of direct communication between terminal apparatuses starts a timer corresponding to a group index that identifies short-range group communication, to which the terminal apparatus belongs, and the timer expires, switching is performed from a first radio resource allocation method, by which a radio resource to be used for the direct communication is requested to a base station apparatus, to a second radio resource allocation method by which the terminal apparatus selects a radio resource to be used for the direct communication.

4 Claims, 6 Drawing Sheets

(51) Int. Cl.
*H04W 92/18* (2009.01)
*H04W 72/02* (2009.01)
*H04W 76/14* (2018.01)
*G01R 31/319* (2006.01)
*G06F 11/36* (2006.01)
*H04B 7/06* (2006.01)
*H04L 12/54* (2013.01)
*H04M 9/02* (2006.01)
*H04W 24/00* (2009.01)

(52) U.S. Cl.
CPC ........ *H04L 12/5692* (2013.01); *H04M 9/027* (2013.01); *H04W 24/00* (2013.01); *H04W 28/06* (2013.01); *H04W 72/02* (2013.01); *H04W 72/042* (2013.01); *H04W 92/18* (2013.01); *H04W 76/14* (2018.02)

(58) Field of Classification Search
CPC ........ H04W 88/04; H04W 48/16; H04B 1/38; H04L 41/0806
See application file for complete search history.

(56) References Cited

U.S. PATENT DOCUMENTS

| | | | | |
|---|---|---|---|---|
| 2015/0312960 A1* | 10/2015 | Kim | ...................... | H04W 72/04 370/329 |
| 2016/0021625 A1* | 1/2016 | Li | ...................... | H04W 72/1289 370/336 |
| 2017/0142741 A1* | 5/2017 | Kaur | .................. | H04W 56/002 |

OTHER PUBLICATIONS

Huawei et al., "D2D impact on scheduling request", 3GPP TSG-RAN WG2 #87, R2-143455, Aug. 18-22, 2014, 2 pages.
Qualcomm Incorporated, "Signaling for ProSe Direct Communication", 3GPP TSG-RAN WG2 #87, R2-143671, Aug. 18-22, 2014, pp. 1-4.
Huawei et al., "ProSe-BSR Triggering and Cancelling Mechanisms", 3GPP TSG-RAN WG2 #87, R2-143458, Aug. 18-22, 2014, 4 pages.
General Dynamics UK Ltd., "Mode Switching in D2D Communication", 3GPP TSG-RAN2 #87, R2-143089, Aug. 18-22, 2014, 4 pages.
"3rd Generation Partnership Project; Technical Specification Group Radio Access Network; Study on LTE Device to Device Proximity Services; Radio Aspects (Release 12)", 3GPP TR 36.843 V12.0.1, Mar. 2014, pp. 1-50.
Sharp, "Further Mode 2 Switching Rules in RLF Exceptional Case", 3GPP TSG RAN WG2 Meeting #87bis, R2-144223, Oct. 6-10, 2014, pp. 1-4.
Ericsson, "Further discussion on mode switching", 3GPP TSG-RAN WG2 #87, Tdoc R2-143558, Aug. 18-22, 2014, pp. 1-4.
Institute for Information Industry, "Mode switching and exceptional cases for D2D Communication", 3GPP TSG-RAN WG2 Meeting #87, R2-143366, Aug. 18-22, 2014, pp. 1-2.
Intel Corporation, "Remaining issues on exceptional cases using Mode 2", 3GPP TSG-RAN WG2 #87, R2-143237, Aug. 18-22, 2014, pp. 1-2.

\* cited by examiner

TERMINAL APPARATUS, BASE STATION APPARATUS, COMMUNICATION METHOD, AND INTEGRATED CIRCUIT

TECHNICAL FIELD

An embodiment of the present invention relates to a technique for a terminal apparatus, a base station apparatus, a communication system, a communication method, and an integrated circuit which are capable of efficiently performing device-to-device communication.

BACKGROUND ART

In the 3GPP (3rd Generation Partnership Project) which is a standardization project, standardization of EUTRA (Evolved Universal Terrestrial Radio Access) is performed, in which high-speed communication is realized by adopting an OFDM (Orthogonal Frequency-Division Multiplexing) communication scheme and flexible scheduling with a predetermined frequency and time unit called a resource block. The EUTRA is also referred to as LTE (Long Term Evolution) in some cases.

Moreover, in the 3GPP, LTE Advanced (also referred to as LTE-A) that achieves higher-speed data transmission and has an upward compatibility with the LTE has been studied.

In the LTE Advanced, a technique by which direct communication is performed from an apparatus (a terminal apparatus) to an apparatus (a terminal apparatus) has been studied. The direct communication from an apparatus to an apparatus is referred to as D2D (Device to Device) or device-to-device communication. Note that, D2D which is standardized in the 3GPP is particularly referred to as LTE-D2D or LTE-Direct as well. Moreover, D2D is simply referred to as services between proximal terminal apparatuses (Proximity based Services: ProSe) in some cases.

In order to realize various kinds of services related to ProSe by using the D2D, a method for discovery of a proximal terminal apparatus, a method for enabling direct communication between terminal apparatuses, and the like have been studied in the 3GPP (NPL 1).

Furthermore, for example, in a case where D2D is used for public safety such as police radio or disaster prevention radio, required is a system by which switching is performed to a mode in which a terminal apparatus autonomously selects a radio resource for the D2D communication and the communication between terminal apparatuses is thereby continued even in a state where a signal from a base station apparatus is unable to be received. Conditions for the switching of a communication scheme (mode) of D2D are described in NPL 2.

CITATION LIST

Non Patent Literature

NPL 1: 3GPP TS 36.843 V12.0.1 (2014 March), http://www.3gpp.org/DynaReport/36843.htm
NPL 2: R2-143089, General Dynamics UK Ltd, http://www.3gpp.org/ftp/tsg_ran/WG2_RL2/TSGR2_87/Docs/

SUMMARY OF INVENTION

Technical Problem

A method by which a terminal apparatus autonomously switches a communication scheme (mode) for continuing D2D communication has been studied. Furthermore, the D2D communication is expected to be used for a purpose other than public safety in the future, but priority of scheduling of such a scheme should be lower than that of D2D communication for public safety. For example, in a case where a load of a cell supporting D2D is high, there is a possibility that it takes more time to allocate a radio resource to the D2D communication having low priority than usual. However, it seems that a method of switching a mode by taking content (type) or a classification of D2D communication into consideration has not been studied so far.

Embodiments of the invention have been made in view of the aforementioned problems and an object thereof is to solve at least one of the aforementioned problems by providing a technique for a terminal apparatus, a base station apparatus, a communication system, a communication method, and an integrated circuit which are capable of efficiently performing device-to-device communication.

Solution to Problem

In order to achieve the aforementioned object, following means are taken. That is, a terminal apparatus in an embodiment of the invention is a terminal apparatus capable of direct communication with another terminal apparatus, in which, in a case where a first radio resource allocation method, by which a radio resource to be used for the direct communication is individually scheduled by a base station apparatus, and a second radio resource allocation method, by which the terminal apparatus autonomously selects a radio resource to be used for the direct communication from allocated radio resources, are supported and the second radio resource allocation method is configured, a transmission buffer report of each group index, which is related to the first radio resource allocation method, is canceled.

Moreover, the aforementioned terminal apparatus may cancel a scheduling request to the base station apparatus, which is triggered on a basis of the transmission buffer report, in a case where the second radio resource allocation method is configured.

Moreover, a base station apparatus in an embodiment of the invention is a base station apparatus that performs communication with a terminal apparatus supporting direct communication with another terminal apparatus, in which information of a timer that is used for determination of switching between a first radio resource allocation method, by which a radio resource to be used for the direct communication is individually scheduled, and a second radio resource allocation method, by which the terminal apparatus autonomously selects a radio resource to be used for the direct communication from radio resources allocated to the terminal apparatus, and that is used by the terminal apparatus, and a radio resource used for the second radio resource allocation method are notified to the terminal apparatus.

Moreover, a communication method in an embodiment of the invention is a communication method for use in a terminal apparatus capable of direct communication with another terminal apparatus, including at least the step of, in a case where a first radio resource allocation method, by which a radio resource to be used for the direct communication is individually scheduled by a base station apparatus, and a second radio resource allocation method, by which the terminal apparatus autonomously selects a radio resource to be used for the direct communication from allocated radio resources, are supported and the second radio resource allocation method is configured, canceling a transmission buffer report of each group index, which is related to the first radio resource allocation method.

The aforementioned communication method may further include a step of canceling a scheduling request to the base station apparatus, which is triggered on a basis of the transmission buffer report, in a case where the second radio resource allocation method is configured.

Moreover, a communication method in an embodiment of the invention is a communication method for use in a base station apparatus that performs communication with a terminal apparatus supporting direct communication with another terminal apparatus, including at least a step of notifying the terminal apparatus of information of a timer that is used for determination of switching between a first radio resource allocation method, by which a radio resource to be used for the direct communication is individually scheduled, and a second radio resource allocation method, by which the terminal apparatus autonomously selects a radio resource to be used for the direct communication from radio resources allocated to the terminal apparatus, and a radio resource used for the second radio resource allocation method.

Moreover, an integrated circuit in an embodiment of the invention is an integrated circuit mounted in a terminal apparatus capable of direct communication with another terminal apparatus, in which the terminal apparatus is caused to exert at least a function of, in a case where a first radio resource allocation method, by which a radio resource to be used for the direct communication is individually scheduled by a base station apparatus, and a second radio resource allocation method, by which the terminal apparatus autonomously selects a radio resource to be used for the direct communication from allocated radio resources, are supported and the second radio resource allocation method is configured, canceling a transmission buffer report of each group index, which is related to the first radio resource allocation method.

The aforementioned integrated circuit may further include the step of canceling a scheduling request to the base station apparatus, which is triggered on a basis of the transmission buffer report, in a case where the second radio resource allocation method is configured.

Moreover, an integrated circuit in an embodiment of the invention is an integrated circuit of a base station apparatus that performs communication with a terminal apparatus supporting direct communication with another terminal apparatus, in which the base station apparatus is caused to exert at least a function of notifying the terminal apparatus of information of a timer that is used for determination of switching between a first radio resource allocation method, by which a radio resource to be used for the direct communication is individually scheduled, and a second radio resource allocation method, by which the terminal apparatus autonomously selects a radio resource to be used for the direct communication from radio resources allocated to the terminal apparatus, and a radio resource used for the second radio resource allocation method.

By using such means, the terminal apparatus, the base station apparatus, the communication system, the communication method, and the integrated circuit become able to be provided with the communication method of efficiently performing device-to-device communication.

In this specification, although each embodiment is disclosed in terms of a technique related to a terminal apparatus, a base station apparatus, a communication system, a communication method, and an integrated circuit which efficiently perform device-to-device communication, a communication scheme which may be applied to each embodiment is not limited to a communication scheme used for EUTRA (LTE, LTE-A).

For example, the technique described in this specification may be used in various communication systems using, for example, code division multiple access (CDMA), time division multiple access (TDMA), frequency division multiple access (FDMA), orthogonal FDMA (OFDMA), single carrier FDMA (SC-FDMA), and other access schemes. In addition, in this specification, a system and a network may be used synonymously.

Advantageous Effects of Invention

According to an embodiment of the invention, it is possible to provide a technique related to a terminal apparatus, a base station apparatus, a communication system, a communication method, and an integrated circuit which efficiently perform device-to-device communication.

DESCRIPTION OF EMBODIMENTS

Figure 1:
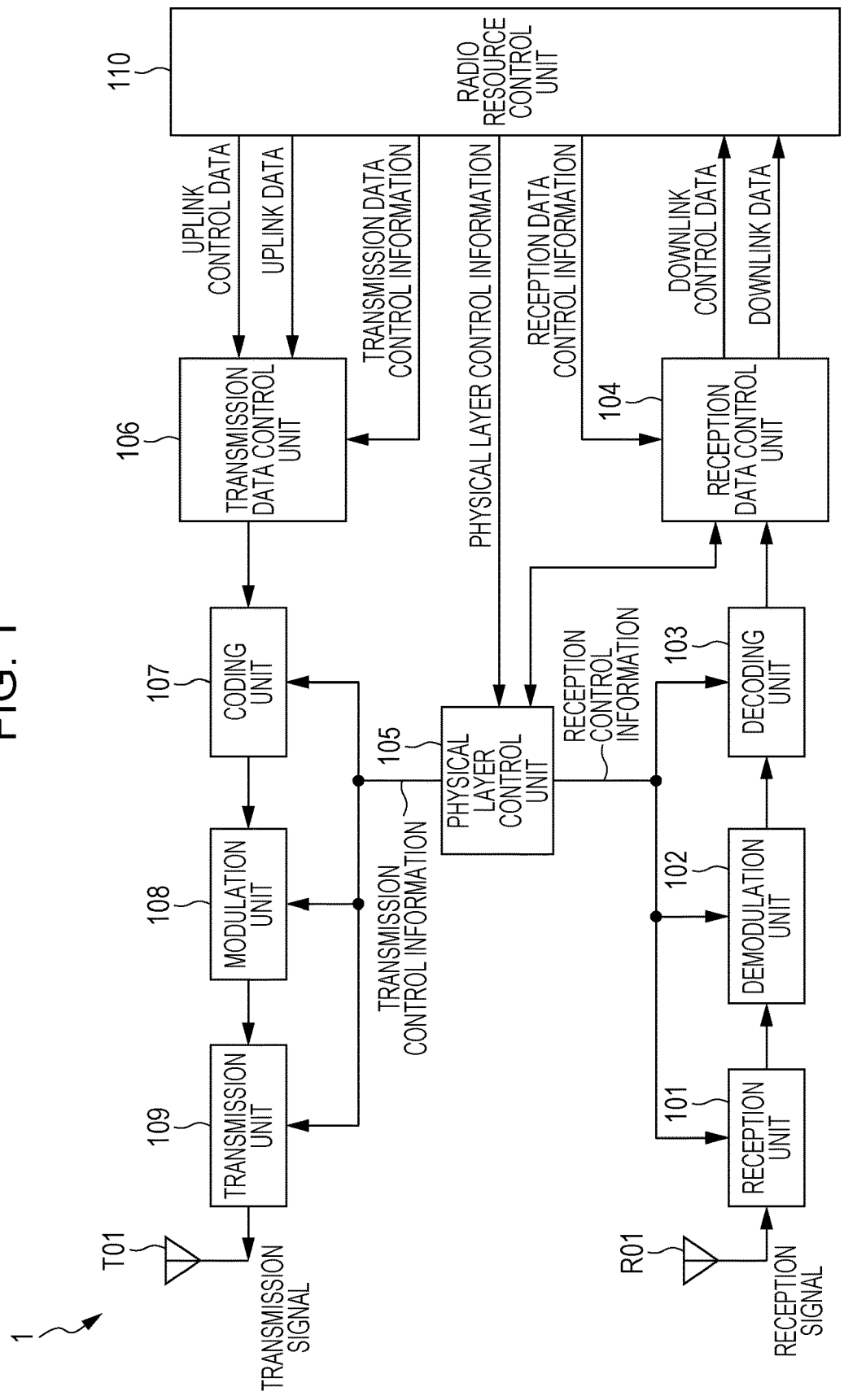
FIG. 1 is a block diagram illustrating an example of a schematic configuration of a terminal apparatus according to an embodiment of the invention.

A technique related to each embodiment of the invention will be briefly described below.
[Physical Channel/Physical Signal]

Description will be given for a physical channel and a physical signal which are primarily used in EUTRA (LTE, LTE-A). A channel means a medium used for signal transmission and reception, and a physical channel means a physical medium used for signal transmission and reception. In the invention, a physical channel and a signal may be used synonymously. There is a possibility that, in a communication system obtained by developing the EUTRA (LTE, LTE-A), for a physical channel, a channel type is added or a structure (configuration) or a format style thereof is modified or added, but even in such a case, there is no influence on the description of each embodiment of the invention.

In the EUTRA, scheduling of the physical channel or the physical signal is managed by using a radio frame. One radio frame has 10 ms and one radio frame is configured by ten subframes. Further, one subframe is configured by two slots (that is, one subframe has 1 ms and one slot has 0.5 ms). Moreover, management is performed by using a resource block as a minimum unit of scheduling, in which physical channels are arranged. The resource block is defined by a fixed frequency domain in which a frequency axis is configured by an assembly of a plurality of subcarriers (for example, twelve subcarriers) and a domain configured by a fixed transmission time interval (one slot).

Synchronization signals are configured by three types of primary synchronization signals (PSSs) and secondary synchronization signals (SSSs) which are configured by 31 types of codes which are arranged alternately in a frequency domain, and a combination of signals of the primary synchronization signals and the secondary synchronization signals indicates 504 cell identifiers (physical cell ID (Physical Cell Identity; PCI)), which identify a base station apparatus, and a frame timing for radio synchronization. A terminal apparatus specifies a physical cell ID of synchronization signals received by cell search.

A physical broadcast channel (PBCH) is transmitted for the purpose of notifying (configuring) a master information block (MIB) which is commonly used by terminal apparatuses in a cell. A base station apparatus notifies (transmits) a master information block message including a MIB by the physical broadcast channel. Information notified (configured) by the master information block message to a terminal apparatus, that is, information notified by the MIB is configuration information of the physical channel (PHICH) related to a downlink frequency bandwidth, a system frame number, and Hybrid ARQ.

The base station apparatus transmits, to the terminal apparatuses, cell common information (broadcast information) excluding the master information block by using a system information block type 1 (SIB 1) message in which a subframe position and a period are statically defined (pre-defined), and a system information message which is a layer 3 message (RRC message) and in which scheduling is performed dynamically in a system information window (SI-window) designated by the system information block type 1.

The system information message is notified by using a physical downlink shared channel in a radio resource indicated by a physical downlink control channel, and transmits one piece of broadcast information (system information block type 2 to type n (SIB 2 to SIB n (n is a natural number))), which is classified in accordance with intended uses thereof, in a corresponding system information window.

As the broadcast information, a cell global identifier (CGI) indicating an identifier of an individual cell, a tracking area identifier (TAI) for managing a standby area by paging, random access configuration information, timing adjustment information, shared radio resource configuration information of each cell, intra-frequency (inter-frequency, inter-RAT) neighboring cell information (Neighboring cell list), uplink access restriction information or the like is notified.

Downlink reference signals are classified into a plurality of types in accordance with intended use thereof. For example, cell-specific RSs (CRSs: Cell-specific reference signals) are pilot signals which are transmitted with predetermined power for each cell, and are downlink reference signals which are iterated periodically in a frequency domain and a time domain on the basis of a predetermined rule. The terminal apparatus is able to measure reception quality of each cell by receiving the cell-specific RSs. Moreover, the terminal apparatus is able to use the cell-specific RSs also as reference signals for demodulation of the physical downlink control channel or the physical downlink shared channel, which is transmitted at the same time with the cell-specific RSs.

As a sequence used for the cell-specific RSs, a sequence that is identifiable for each cell is used. The cell-specific RSs may be transmitted in all downlink subframes from the base station apparatus, or may be transmitted only in a downlink subframe designated by the base station apparatus. Moreover, the terminal apparatus may receive the cell-specific RSs in all downlink subframes or only in a downlink subframe designated by the base station apparatus.

The downlink reference signals are used also for estimation of channel fluctuation of the downlink. The downlink reference signals used for the estimation of channel fluctuation are referred to as channel state information reference signals (CSI-RSs, CSI reference signals). Moreover, for the CSI reference signals, a signal may not be transmitted in practice or may be transmitted with zero power. On the other hand, CSI reference signals for which a signal is transmitted in practice may be referred to as non-zero power CSI reference signals (NZP CSI-RSs: Non Zero Power Channel State Information Reference Signals). Additionally, a radio resource of downlink used for measuring an interference component may be referred to as a channel state information interference measurement resource (CSI-IMR) or a CSI-IM resource.

The downlink reference signals which are configured individually to the terminal apparatus are referred to as UE specific reference signals (URSs), or demodulation reference signals (DMRSs), and referred to for channel compensation processing of a channel when the physical downlink control channel, an enhanced physical downlink control channel, or the physical downlink shared channel is demodulated.

The physical downlink control channel (PDCCH) is transmitted in several OFDM symbols (for example, 1 to 4 OFDM symbols) from beginning of each subframe. The enhanced physical downlink control channel (EPDCCH) is a physical downlink control channel which is arranged in an OFDM symbol in which the physical downlink shared channel PDSCH is arranged. The PDCCH or the EPDCCH is used for the purpose of notifying the terminal apparatus of radio resource allocation information according to scheduling of the base station apparatus, control information for giving instruction of an adjustment amount of increase or decrease in transmit power, and the like. Hereinafter, when simply described as the physical downlink control channel (PDCCH), it means both physical channels of the PDCCH and the EPDCCH unless otherwise specified.

The terminal apparatus needs to acquire radio resource allocation information called uplink grand in the case of transmission and downlink grant (also referred to as downlink assignment) in the case of reception from the physical downlink control channel by monitoring the physical downlink control channel addressed to the terminal apparatus before transmitting or receiving a layer 2 message (MAC-CE) and a layer 3 message (paging, system information, and the like) and by receiving the physical downlink control channel addressed to the terminal apparatus. In the case of supporting D2D, the physical downlink control channel is able to notify D2D grant. Note that, the physical downlink control channel may be configured so as to be, other than to be transmitted in the OFDM symbols described above, transmitted in a domain of a resource block allocated from the base station apparatus to the terminal apparatus in an individual (dedicated) manner.

A physical uplink control channel (PUCCH) is used for performing a reception confirmation response (ACK/NACK: Acknowledgement/Negative Acknowledgement) of downlink data transmitted on the physical downlink shared channel, channel (channel state) information (CSI: Channel State Information) of the downlink, and a radio resource allocation request (radio resource request, scheduling request (SR)) of the uplink.

CSI includes a CQI (Channel Quality Indicator), a PMI (Precoding Matrix Indicator), a PTI (Precoding Type Indicator), and an RI (Rank Indicator). Each indicator may be described as indication.

The physical downlink shared channel (PDSCH) is used also for notifying the terminal apparatus of, in addition to the downlink data, layer 3 messages such as paging and system information. Radio resource allocation information of the physical downlink shared channel is indicated (notified) by the physical downlink control channel. The physical downlink shared channel is arranged and transmitted in the OFDM symbol other than the OFDM symbol in which the physical downlink control channel is transmitted. That is, the physical downlink shared channel and the physical downlink control channel are subjected to time division multiplexing in one subframe.

A physical uplink shared channel (PUSCH) mainly transmits uplink data and uplink control data, and may include control data such as CSI or ACK/NACK. Moreover, it is used also for notifying the base station apparatus of uplink control information, in addition to the uplink data, as the layer 2 message and the layer 3 message from the terminal apparatus. Similarly to the downlink, radio resource allocation information of the physical uplink shared channel is indicated by the physical downlink control channel.

An uplink reference signal (also referred to as an uplink pilot signal or an uplink pilot channel) includes a demodulation reference signal (DMRS) which is used by the base station apparatus for demodulating the physical uplink control channel PUCCH and/or the physical uplink shared channel PUSCH, and a sounding reference signal (SRS) which is used by the base station apparatus mainly for estimating a channel state of the uplink. As the sounding reference signal, there are a periodic sounding reference signal (Periodic SRS) which is transmitted periodically and an aperiodic sounding reference signal (Aperiodic SRS) which is transmitted when an instruction is given from the base station apparatus.

A physical random access channel (PRACH) is a channel which is used for notifying (configuring) a preamble sequence and has a guard time. The preamble sequence is configured so as to notify the base station apparatus of information by a plurality of sequences. For example, when 64 types of sequences are prepared, it is possible to indicate 6-bit information to the base station apparatus. The physical random access channel is used as access means to the base station apparatus from the terminal apparatus.

The terminal apparatus uses the physical random access channel, for example, for making a radio resource request of the uplink when the physical uplink control channel is not configured, or requesting, to the base station apparatus, timing adjustment information (also called timing advance (TA)) which is required for aligning an uplink transmission timing to a reception timing window of the base station apparatus. Moreover, the base station apparatus may also request the terminal apparatus to initiate random access procedure by using the physical downlink control channel. Note that, in the case of the D2D, adjustment of a transmission timing is performed by using the TA also for transmission to another terminal apparatus. The TA (first timing adjustment information) for the base station apparatus and the TA (D2D-TA (second timing adjustment information)) related to the D2D may be the same or may be different.

The D2D-TA may be notified with the same value in a cell by the broadcast information, or may be notified individually from the base station apparatus to the terminal apparatus. Moreover, similarly to the TA, the D2D-TA may be configured so as to have a timing (value) adjusted by a signal (for example, a MAC control element or the like) from the base station apparatus.

The layer 3 message is a message handled by a protocol of a control-plane (CP (C-Plane)) which is exchanged between RRC (radio resource control) layers of the terminal apparatus and the base station apparatus, and may be used synonymously with RRC signaling or an RRC message. Note that, against the control-plane, a protocol handling user data is referred to as a user-plane (UP (U-Plane)).

Using a D2D Synchronization Signal (D2DSS), a Physical D2D Synchronization Channel (PD2DSCH), or the like as a physical channel related to the D2D has been examined. The D2D synchronization signal may be configured by two synchronization signals of a PD2DSS (Primary D2DSS) and an SD2DSS (Secondary D2DSS).

Moreover, the physical D2D synchronization channel may be transmitted from a terminal apparatus which transmits the D2D, and may be transmitted for the purpose of notifying control information (for example, a synchronization ID related to the transmitting terminal apparatus, a resource pool, a system bandwidth, TDD subframe configuration, and the like) related to the D2D, a D2D frame number, etc.

In addition, the terminal apparatus which transmits the D2D is able to transmit scheduling assignments (SA) to a terminal apparatus which receives the D2D. The SA is able to explicitly or implicitly notify timing adjustment information related to transmission data related to D2D (D2D Reception Timing Advance (D2D-TA)), ID information with which a content (type) of the D2D is identified, radio resource patterns of the transmission data (RPT; Resource Patterns for Transmission) corresponding to the ID information, and the like.

The terminal apparatus which has received the SA is able to perform reception by adjusting a reception timing of the transmission data related to D2D on the basis of a timing acquired from the D2D synchronization signal and the timing adjustment information included in the SA. Note that, the timing adjustment information of the transmission data related to D2D may be transmitted by the PD2DSCH.

Information of the transmission data related to D2D, which is indicated by the RPT, includes bandwidth information, resource information of a frequency domain, frequency hopping information, resource information of a time domain, and the like. The terminal apparatus which transmits the D2D may use the PUSCH as a physical channel by which the SA and the transmission data related to D2D are notified, or may allocate a dedicated physical channel to each of them.

For example, the SA may be transmitted with use of a physical channel called a PSCCH (Physical sidelink control channel). Moreover, the transmission data related to D2D may be transmitted with use of a physical channel called a PSSCH (Physical sidelink shared CHannel) in a case of communication, or may be transmitted with use of a physical channel called a PSDCH (Physical sidelink discovery CHannel) in a case of discovery. Hereinafter, SA is used for meaning either a physical channel including SA or SA notified by the physical channel. Moreover, transmission data related to D2D is used for meaning either a physical channel including transmission data related to D2D or transmission data notified by the physical channel.

In the case of using the PUSCH, the terminal apparatus which receives the D2D needs to receive the PUSCH with a corresponding frequency and perform decoding.

Note that, since a physical channel and a physical signal other than the above are not involved much in each embodiment of the invention, detailed descriptions thereof will be omitted. Examples of the physical channel or the physical signal whose description will be omitted include a physical control format indicator channel (PCFICH), a physical HARQ indicator channel (PHICH: Physical Hybrid ARQ Indicator CHannel), a physical multicast channel (PMCH), and the like.

[Radio Network and Cell Type]

A communication available range (communication area) of each frequency which is controlled by the base station apparatus is regarded as a cell. In this case, respective communication areas covered by the base station apparatus may have different areas and different shapes for each frequency. Moreover, areas which are covered may be different for each frequency. A radio network in which cells which are different in types of base station apparatuses and sizes of cell radii are mixed in areas with the same frequency or different frequencies to form one communication system is referred to as a heterogeneous network.

The terminal apparatus may regard, as a suitable cell, a cell to which access of the terminal apparatus is determined not to be prohibited on the basis of broadcast information notified from the base station apparatus and in which reception quality of the downlink fulfills a designated condition and, as a result thereof, normal services are permitted when the terminal apparatus camps thereon. When the terminal apparatus moves from the cell camped on to another cell, the movement is performed by cell re-selection procedure in a non-radio resource control connection state (in an idle mode or non-communication state), or by handover procedure at a time of a radio resource control connection (in a connected mode or a communication state).

The terminal apparatus may regard a cell, which is not determined as a suitable cell by cell selection (cell re-selection) procedure, as a cell (limit cell) in which only a part of services is permitted. Note that, the terminal apparatus is able to camp on even the limit cell. Examples of the part of the services include emergency call. In a state of camping on a cell (idle mode) or in the connected mode with a certain cell, the terminal apparatus may be judged to be positioned in an area in which communication with the base station apparatus is allowed, that is, in a service region of the cell (in-coverage).

The base station apparatus manages one or more cells for each frequency. One base station apparatus may manage a plurality of cells. Cells are classified into a plurality of types in accordance with sizes of areas (cell sizes) in which communication is allowed with the terminal apparatus. For example, cells are classified into macro cells and small cells. A small cell is a cell which generally covers from several meters to several tens of meters of a radius. Further, the small cells are classified into femto cells, pico cells, nano cells, and the like in accordance with sizes of areas thereof in some cases.

When the terminal apparatus is able to communicate with a certain base station apparatus, a cell which is used for communication with the terminal apparatus is a serving cell and other cells which are not used for the communication are referred to as neighboring cells among cells of the base station apparatus.

A frequency of the serving cell is also referred to as the same frequency (Intra-frequency) or a serving frequency. A frequency which is not the same frequency is referred to as a different frequency (Inter-frequency). In a case where a plurality of serving cells are configured with respect to the terminal apparatus by a technique such as carrier aggregation, dual connectivity, or the like, it is regarded that there are a plurality of corresponding serving frequencies.

[Buffer Status Report]

A MAC layer of the terminal apparatus has a function of giving notification (report) to the base station apparatus by using information of a data amount of transmission buffer corresponding to a logical channel. The function is called a buffer status report (BSR). For example, the BSR is triggered in the MAC layer in each of: (1) a case where uplink data that is able to be transmitted is generated in a higher layer (RLC layer, PDCP layer), and furthermore, priority of a logical channel related to the uplink data is higher than priority of data in the transmission buffer, or there is no other uplink data that is able to be transmitted; (2) a case where a retransmission timer (retxBSR-Timer) related to BSR expires; (3) a case where a periodic timer (periodicBSR-Timer) related to BSR expires; and (4) a case where there is a padding bit (padding region) that is greater than a MAC control element of the BSR.

In a case where any of the BSR trigger conditions is met, and a radio resource (new transmission of a physical uplink shared channel PUSCH) for notifying the BSR in a certain subframe is not allocated, when a physical uplink control channel PUCCH is allocated (available), the MAC layer instructs a PHY layer to transmit a scheduling request by using the physical uplink control channel PUCCH.

Alternatively, when the physical uplink control channel PUCCH for transmitting the scheduling request is not allocated (not available), the MAC layer starts random access procedure for the scheduling request and instructs the PHY layer to transmit a physical random access channel PRACH. Note that, the MAC layer keeps the BSR in a triggered state until the radio resource is allocated. The triggered BSR is canceled when the BSR is transmitted to the base station apparatus.

BSRs are classified into regular BSRs, periodic BSRs, and padding BSRs in accordance with the trigger conditions. The BSR triggered in accordance with the aforementioned condition (1) or (2) is a regular BSR, the BSR triggered in accordance with the aforementioned condition (3) is a periodic BSR, and the BSR triggered in accordance with the aforementioned condition (4) is a padding BSR.

The BSR is reported by using a MAC control element. As a format (bit structure) of the MAC control element, with which the BSR is reported, there are a short BSR that reports a buffer state of one logical channel group and a long BSR that reports buffer states of a plurality of logical channel groups. Regarding transmission of the padding BSR, when there is not a padding region which is sufficient to transmit the long BSR, a format of a truncated BSR, with which a BSR of a logical channel having highest priority is transmitted, is used.

The MAC control element for reporting the BSR is referred to as a BSR MAC control element. In a case where at least one BSR is triggered in the MAC layer of the terminal apparatus and the BSR is not canceled, when there is radio resource allocation of the uplink for new transmission in a certain subframe, the terminal apparatus generates the BSR MAC control element, and starts or restarts the periodic timer (periodicBSR-Timer) related to BSR and the retransmission timer (retxBSR-Timer) related to BSR. Also, the retransmission timer is restarted in a case where uplink grant with respect to new uplink data is instructed.

[D2D]

A basic technology of D2D will be described briefly.

The D2D is classified into at least a technique for discovering a proximal terminal apparatus (discovery) and a technique by which a terminal apparatus performs direct communication with one or more terminal apparatuses (direct communication (also referred to as communication)). The discovery and the communication are collectively called ProSe in some cases.

In the D2D, a resource (radio resource) and a configuration which are related to the D2D and used by the terminal apparatus may be configured (controlled) by the base station apparatus. That is, in a case where the terminal apparatus is in the non-radio resource control connection state (idle mode), the radio resource and the configuration related to the D2D may be notified for each cell with broadcast information, and in a case where the terminal apparatus is in a radio resource control connection state (connected mode), the radio resource and the configuration related to the D2D may be notified with an RRC message.

That is, the D2D may possibly be realized by terminal apparatuses which are capable of direct communication between terminal apparatuses (D2D capable, D2D supported) and a base station apparatus which is capable of controlling a resource for direct communication between the terminal apparatuses. Alternatively, the D2D may possibly be realized by pre-configuration of the terminal apparatuses which are capable of direct communication between terminal apparatuses.

Moreover, in the direct communication, a radio resource by which scheduling assignments (SA) are transmitted is provided to the terminal apparatus from a resource pool (SA resource pool) which pools for the SA. A terminal apparatus which transmits the D2D transmits the SA with the radio resource (a time and a frequency) which is included in the resource pool. A terminal apparatus which receives the D2D receives the SA with the radio resource (the time and the frequency) which is included in the resource pool.

In addition, in the direct communication, a radio resource by which transmission data related to D2D is transmitted is provided to the terminal apparatus from a resource pool (D2D data resource pool) which pools for the transmission data related to D2D (D2D data). The terminal apparatus which transmits the D2D transmits the transmission data related to D2D by using the radio resource (a time and a frequency) which is designated from the resource pool. The terminal apparatus which receives the D2D receives the transmission data related to the D2D by using the radio resource (the time and the frequency) which is designated from the resource pool. The resource pool may be indicated with frequency information, information which indicates a range of a resource block to be allocated, information of a frame number or a subframe number at which the resource pool is started and an offset value, or the like.

In this case, the resource pool (first resource pool) in which the radio resource to be used for the SA is pooled and the resource pool (second resource pool) in which the radio resource to be used for the transmission data related to D2D is pooled may be configured in advance (reserved) with broadcast information, individually notified (or broadcasted) from the base station apparatus to each terminal apparatus, notified (or broadcasted) from another terminal apparatus, pre-configured, or allocated in a semi-static manner.

In a case where the allocation is performed by pre-configuration, the configuration may be provided by a UICC (Universal Integrated Circuit Card) or an application for a terminal apparatus, which is recorded in the terminal apparatus. The UICC may be a smart card provided by hardware, or may be provided by software.

Here, as a method of allocating the radio resource related to D2D (SA, transmission data related to D2D, and the like) from the resource pool to the terminal apparatus, a method (a first radio resource allocation method (also referred to as Mode 1 or a scheduled method)) in which the terminal apparatus notifies, to the base station apparatus, that there is transmission data related to D2D and thereby the radio resource is individually allocated from the base station apparatus to the terminal apparatus may be used, or a method (a second radio resource allocation method (also referred to as Mode 2 or an autonomous method) in which the terminal apparatus selects the radio resource from broadcast information or the resource pool, which is configured in advance (reserved), in accordance with a certain regulation (or in a random manner) for use may be used.

Mode 1 is a mode of the direct communication, which is used when the terminal apparatus is positioned in a range regarded as being in coverage of a cell of the base station apparatus which supports the D2D. That is, Mode 1 is a mode used, in the idle mode, in a state where the terminal apparatus camps on the cell supporting the D2D, and used, in the connected mode, in a state where the terminal apparatus is connected with the cell. The terminal apparatus which performs communication of the D2D of Mode 1 in the connected mode transmits a buffer status report based on a buffering quantity of the transmission data related to D2D (a buffer status report for D2D (ProSe BSR)) to the base station apparatus in order to request a radio resource to be used for the communication.

Mode 2 is a mode of the direct communication, which is used when the terminal apparatus is not positioned in the range regarded as being in the coverage of the cell of the base station apparatus which supports the D2D (out-of-coverage). Note that, even when a radio resource allocated by the base station apparatus is used (that is, Mode 1), the terminal apparatus is able to use a radio resource selected by the terminal apparatus (that is, Mode 2) exceptionally.

Note that, in a case where the terminal apparatus in the coverage camps on or is connected with a cell, in which Mode 1 is not allowed, and the cell supports Mode 2, Mode 2 is able to be used in accordance with an instruction from the base station apparatus. In this case, as a radio resource of Mode 2, the terminal apparatus may use a radio resource selected by pre-configuration or may use a radio resource notified from the base station apparatus as the radio resource allowed to be used for Mode 2.

Figure 6:
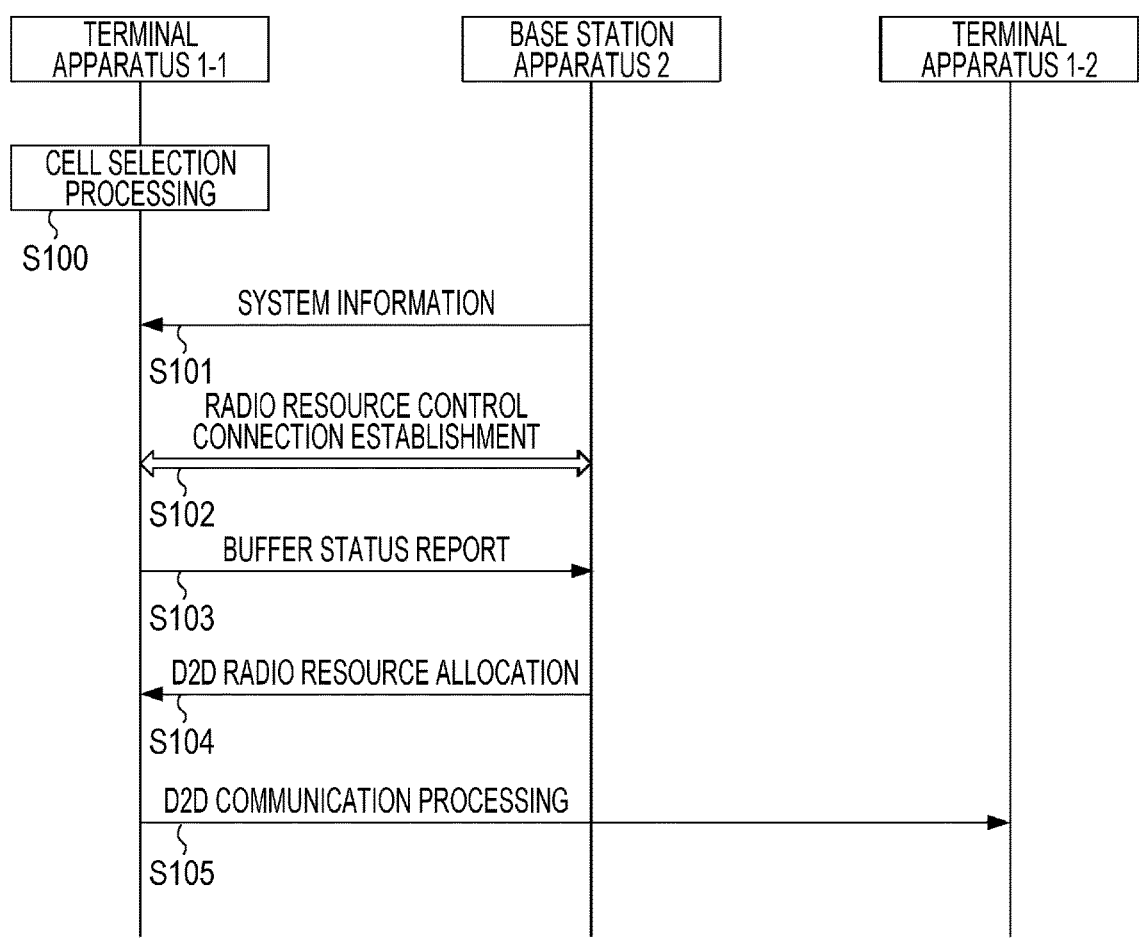
FIG. 6 is a flowchart illustrating an example of procedure in a case where a terminal apparatus that transmits D2D data and a terminal apparatus that receives the D2D data perform D2D communication.

FIG. 6 is a flowchart illustrating an example of a case where a terminal apparatus 1-1 (D2D transmission UE) which is capable of transmitting D2D data and a terminal apparatus 1-2 (D2D reception UE) which is capable of receiving the D2D data perform communication of D2D in Mode 1.

The terminal apparatus 1-1 in FIG. 6 is in the idle mode. In a case of being interested in D2D, the terminal apparatus 1-1 performs cell selection processing on the basis of information of a received system information message (step S100). In the cell selection processing, in accordance with broadcast information which indicates whether the D2D is supported by an uplink band with which an RF (Radio Frequency) circuit of the terminal apparatus 1-1 is compatible, the terminal apparatus 1-1 changes the camped cell when necessary.

The terminal apparatus 1-2 also executes step S100 similarly. That is, in the case of being interested in the D2D, on the basis of information of the received system information message, the terminal apparatus 1-2 performs cell selection processing as necessary in accordance with broadcast information which indicates whether the D2D is supported by an uplink frequency (frequency band) with which an RF (Radio Frequency) circuit of the terminal apparatus 1-2 is compatible.

Next, when selecting and camping on a cell of a base station apparatus 2, in which the D2D is supported, the terminal apparatus 1-1 receives a system information message that is an RRC message (step S101). The system information message is used for the purpose of notifying the terminal apparatus 1-1 and the terminal apparatus 1-2 of configuration information related to D2D (for example, D2DSS configuration information, PD2DSCH configuration information, D2D information of a neighboring cell, resource pool information for SA, resource pool information for transmission data related to D2D, permission information of Mode 1/Mode 2, or the like). Such information may be transmitted from the base station apparatus 2 by a certain independent system information block (for example, SIB 18), or may be transmitted by an individual RRC message in a case where the terminal apparatus 1-1 (the terminal apparatus 1-2) is in a communication state.

At this time, it is set that the D2D in Mode 1 is permitted (or the D2D in Mode 2 is not permitted) in the cell of the base station apparatus 2. In this case, the terminal apparatus 1-1 which is interested in the D2D and in the idle mode starts a series of procedure related to radio resource control connection establishment (RRC connection establishment), which is indicated at step S102, in order to start communication processing of the D2D in Mode 1, and shifts to the connected mode.

The terminal apparatus 1-1 may use the same procedure as a conventional one as the procedure of the radio resource control connection establishment. For example, the terminal apparatus 1-1 performs random access procedure on the basis of common configuration acquired from system information and transmits a radio resource control request (RRC Connection Request) message by using an uplink radio resource designated by the base station apparatus 2. At this time, the terminal apparatus 1-1 may explicitly notify, to the base station apparatus 2, that the radio resource control request is for the D2D.

Moreover, during the procedure, the terminal apparatus 1-1 receives a radio resource control configuration (RRC Connection Setup) message through a downlink radio resource designated by the base station apparatus 2, and applies individual configuration information (Dedicated Configuration) which is to be used in the connected mode. Thereafter, the terminal apparatus 1-1 transmits a radio resource control configuration complete (RRC Connection Setup Complete) message by using an uplink radio resource designated by the base station apparatus 2, and completes the radio resource control connection establishment procedure.

The terminal apparatus 1-1 may be notified of the configuration information related to D2D with the radio resource control configuration message in the procedure or by using another RRC message (for example, a radio resource control reconfiguration (RRC Connection Reconfiguration) message) after completion of the radio resource control connection establishment procedure.

In order to request a radio resource required for the D2D communication in Mode 1, the terminal apparatus 1-1 transmits, to the base station apparatus 2, a MAC control element (ProSe BSR MAC-CE) including a buffer status report (ProSe BSR) for the D2D (step S103). The terminal apparatus 1-1 may request an uplink radio resource by a scheduling request (SR) when a radio resource for transmitting the ProSe BSR MAC-CE is not allocated. The terminal apparatus 1-1 may include an information bit indicating a group index in the ProSe BSR MAC-CE.

The group index is an index number corresponding to a group identifier (group ID, ProSe Layer2 Group ID) for identifying a target (group) performing short-range group communication (group cast communication, ProSe Group Communication). The group index and a group ID are mapped in a one-to-one manner. A group ID is assigned to each target (group) performing short-range group communication. For the short-range group communication, by guaranteeing communication which is exclusive of other groups or occupied before other groups (pre-empted), communication which is effective only for the terminal apparatuses 1-1 (terminal apparatuses 1-2) which belongs to each group is performed.

The group ID may be configured by combining a transmission source layer 2 ID (Source Layer2-ID) and a transmission destination layer 2 ID (Destination Layer2-ID). The terminal apparatus 1-1 may transmit a new MAC control element indicating a group index.

The group ID or the group index is able to be used, for example, as priority information (group priority information) for, in the base station apparatus 2, preferentially allocating a radio resource used for the D2D communication in Mode 1. When group indexes are used for identifying short-range group communication of, for example, n groups at most, values (numbers) of 0, 1, . . . , n−1 may be configured to the n groups. Association (correspondence) between the group indexes and group IDs may be performed in the terminal apparatus 1-1 or in the base station apparatus 2, or may be determined in advance by pre-configuration.

The terminal apparatus 1-1 may transmit association information between the group indexes and the group IDs to the base station apparatus 2 in advance. The base station apparatus 2 may receive the association information between the group indexes and the group IDs from the terminal apparatus 1-1. The association between the group indexes and the group IDs may be notified with an RRC message or a MAC control element.

The base station apparatus 2 which has received the ProSe BSR transmits D2D radio resource allocation (D2D grant), which is used for the D2D in Mode 1, to the terminal apparatus 1-1 (step S104). The base station apparatus 2 may perform scheduling by taking a state (load) of the radio resource allocation, an interference quantity, or the like into consideration in addition to the group indexes and a buffering quantity which are included in the ProSe BSR.

The terminal apparatus 1-1 starts D2D communication processing by using the radio resource instructed by the D2D radio resource allocation (D2D grant) (step S105). For example, by the radio resource allocated by the D2D grant, the terminal apparatus 1-1 may transmit SA or transmit transmission data related to D2D.

Description will hereinafter be given in detail for appropriate embodiments of the invention with reference to accompanying drawings while considering above matters. Note that, in the description of the embodiments of the invention, when it is judged that specific description of known functions or configurations related to the embodiments of the invention makes the subject matter of the embodiments of the invention unclear, the detailed description thereof will be omitted.

<First Embodiment>

A first embodiment of the invention will be described below.

FIG. 1 is a block diagram illustrating an example of a terminal apparatus 1 in the first embodiment of the invention. The terminal apparatus 1 is composed of at least a reception unit 101, a demodulation unit 102, a decoding unit 103, a reception data control unit 104, a physical layer control unit 105, a transmission data control unit 106, a coding unit 107, a modulation unit 108, a transmission unit 109, a radio resource control unit 110, a transmit antenna T01, a receive antenna R01. The "unit" in the figure is an element which realizes functions and each procedure of the terminal apparatus 1, which is represented also as a term of a section, a circuit, a configuration apparatus, a device, and the like.

Note that, the terminal apparatus 1 which is capable of D2D (or is interested in D2D or supports D2D) is abbreviated as the terminal apparatus 1 simply in some cases. In communication related to D2D, the terminal apparatus 1 is able to become either of the terminal apparatus 1 that transmits the D2D data (D2D transmission (the terminal apparatus 1-1 of FIG. 6)) and the terminal apparatus 1 that receives the D2D data (D2D reception (the terminal apparatus 1-2 of FIG. 6)).

The radio resource control unit 110 executes each function of an RRC (Radio Resource Control) layer which carries out radio resource control of the terminal apparatus 1. The reception data control unit 104 and the transmission data control unit 106 execute each function of a MAC (Medium Access Control) layer, an RLC (Radio Link Control) layer, and a PDCP (Packet Data Convergence Protocol) layer, which manage a data link layer.

Note that, in order to support, in parallel (simultaneously), reception processing and transmission processing of a plurality of frequencies (frequency bands, frequency bandwidths) or in the same subframe of one certain cell, the terminal apparatus 1 may have a configuration including a plurality of sets each of which is formed by a part or whole of reception-based blocks (the reception unit 101, the demodulation unit 102, the decoding unit 103, and the receive antenna R01), a plurality of frequencies (frequency band, frequency bandwidths), and transmission-based blocks (the coding unit 107, the modulation unit 108, the transmission unit 109, and the transmit antenna T01).

With regard to the reception processing of the terminal apparatus 1, from the radio resource control unit 110, reception data control information is input to the reception data control unit 104, and physical layer control information which is a control parameter for controlling each block is input to the physical layer control unit 105. The physical layer control information is information which includes parameter configuration required for radio communication control of the terminal apparatus 1, which is formed of reception control information and transmission control information.

The physical layer control information is configured by, for example, radio connection resource configuration, cell-specific broadcast information, or a system parameter, which is transmitted in an individual (dedicated) manner from the base station apparatus 2 to the terminal apparatus 1, and input to the physical layer control unit 105 as necessary by the radio resource control unit 110. The physical layer control unit 105 appropriately inputs the reception control information which is control information about reception to the reception unit 101, the demodulation unit 102, and the decoding unit 103.

The reception control information may include, as downlink scheduling information, information such as information of a reception frequency band, a reception timing related to physical channels and physical signals, a multiplexing method, radio resource control information, SA resource pool information, D2D resource pool information, and a transmission timing related to D2D (or D2D-TA which is timing adjustment information related to D2D). The reception data control information is downlink control information including secondary cell deactivation timer information, DRX control information, multi-cast data reception information, downlink retransmission control information, SA reception control information, D2D reception control information, and the like, and includes control information about each downlink of the MAC layer, the RLC layer, and the PDCP layer.

A reception signal is received by the reception unit 101 via the receive antenna R01. In the case of D2D, the reception signal is a transmission signal transmitted by the terminal apparatus 1 in some cases. The reception unit 101 receives a signal from the base station apparatus 2 (or the terminal apparatus 1) in accordance with a frequency and a frequency band which are notified with the reception control information. The received signal is input to the demodulation unit 102. The demodulation unit 102 performs demodulation of the signal. The demodulation unit 102 inputs the demodulated signal to the decoding unit 103.

The decoding unit 103 decodes the input signal and inputs each decoded data (downlink data and downlink control data, which are also referred to as a downlink transport block) to the reception data control unit 104. A MAC control element (MAC-CE) transmitted from the base station apparatus 2 with each data is also decoded at the decoding unit 103 and related data is input to the reception data control unit 104.

The reception data control unit 104 performs control of the physical layer control unit 105 (for example, activation/deactivation of a cell, DRX control, transmission timing adjustment, and the like) based on the received MAC control element, buffering for each decoded data, and error correction control (HARQ) for retransmitted data. Among respective pieces of data input to the reception data control unit 104, related data is input (transferred) to the radio resource control unit 110.

In addition, the reception data control unit 104 adjusts a reception timing (frame synchronization, subframe synchronization, symbol synchronization, etc.) of the terminal apparatus 1 based on a reception timing of a synchronization signal received by the reception unit 101 or the like. The reception timing is managed in the physical layer control unit 105 and fed back to the reception unit 101 or the transmission unit 109, and thereby downlink synchronization and/or uplink synchronization are/is appropriately adjusted.

Moreover, with regard to transmission processing of the terminal apparatus 1, from the radio resource control unit 110, transmission data control information is input to the transmission data control unit 106, and the physical layer control information which is the control parameter for controlling each block is input to the physical layer control unit 105. The physical layer control unit 105 appropriately inputs transmission control information, which is control information about transmission, to the coding unit 107, the modulation unit 108, and the transmission unit 109.

The transmission control information includes, as uplink scheduling information, information such as coding information, modulation information, information of a transmission frequency band, timing information (or TA) related to physical channels and physical signals, a multiplexing method, radio resource arrangement information, SA resource pool information, D2D resource pool information, and timing information related to D2D (or D2D-TA).

The transmission data control information is uplink control information which includes DTX control information, random access configuration information, uplink shared channel information, logical channel priority information, resource request configuration information, cell group information, uplink retransmission control information, a buffer status report, D2D transmission control information, and the like. The radio resource control unit 110 may configure plural pieces of random access configuration information respectively corresponding to a plurality of cells to the transmission data control unit 106.

The radio resource control unit 110 manages timing adjustment information and a transmission timing timer, which are used for adjustment of an uplink transmission timing, and manages a state of the uplink transmission timing (a transmission timing adjustment state or a transmission timing non-adjustment state) for each cell (or for each cell group or for each TA group). The timing adjustment information and the transmission timing timer are included in the transmission data control information.

Note that, when it is necessary to manage the state of a plurality of uplink transmission timings, the transmission data control unit 106 manages timing adjustment information corresponding to an uplink transmission timing of each of the plurality of cells (or a cell group, a TA group). Furthermore, the transmission data control unit 106 also manages a state of a transmission timing related to D2D when necessary. The resource request configuration information includes at least maximum transmission counter configuration information and radio resource request prohibit timer information. The radio resource control unit 110 may configure plural pieces of resource request configuration information respectively corresponding to a plurality of cells to the transmission data control unit 106.

Transmission data (uplink data and uplink control data, which are also referred to as an uplink transport block) which is invoked at the terminal apparatus 1 is input to the transmission data control unit 106 at any timing from the radio resource control unit 110 (or a higher layer unit such as a non-access stratum layer unit (not illustrated)). At this time, the transmission data control unit 106 calculates a quantity of the input transmission data (uplink buffering quantity). Moreover, the transmission data control unit 106 has a function of discriminating whether the input transmission data is data belonging to a control-plane or data belonging to a user-plane.

When the transmission data is input, the transmission data control unit 106 stores the transmission data in an uplink buffer (not illustrated) in the transmission data control unit 106. Moreover, on the basis of a degree of priority of the transmission data stored in the uplink buffer, the transmission data control unit 106 performs multiplexing and assembling, and generates a MAC PDU. Then, the transmission data control unit 106 judges whether a radio resource needed for transmission of the input transmission data is allocated to the terminal apparatus 1.

On the basis of the radio resource allocation, the transmission data control unit 106 selects any one of a physical uplink shared channel PUSCH, a radio resource request using a physical uplink control channel (SR-PUCCH), and a radio resource request using a physical random access channel, and requests, to the physical layer control unit 105, control processing for transmitting the selected channel. Additionally, on the basis of radio resource allocation for D2D, the transmission data control unit 106 requests, to the physical layer control unit 105, control processing for transmitting SA (PPSACH) or transmission data related to D2D (PPCSCH).

Here, on the basis of whether the input transmission data is normal transmission data for the base station apparatus 2 or transmission data related to D2D for another terminal apparatus 1, the transmission data control unit 106 generates a different buffer status report. In other words, as the MAC control element, the transmission data control unit 106 generates each of a buffer status report based on a buffering quantity of the normal transmission data (a normal buffer status report (Normal BSR), a first buffer status report) and a buffer status report based on a buffering quantity of the transmission data related to D2D (a buffer status report for D2D (ProSe BSR), a second buffer status report).

A plurality of ProSe BSRs may be generated for each group. Additionally, the coding unit 107 appropriately codes each data in accordance with the transmission control information, and inputs the resultant to the modulation unit 108.

The modulation unit 108 performs modulation processing appropriately on the basis of a channel structure for transmitting each of coded data. The transmission unit 109 performs mapping of each data subjected to the modulation processing to a frequency domain, converts a signal of the frequency domain into a signal of a time domain, and carries it on a carrier wave of a given frequency to perform power amplification. The transmission unit 109 further adjusts the uplink transmission timing in accordance with the timing adjustment information for each cell (or for each cell group, for each TA group), which is input from the radio resource control unit 110, and transmits a signal via the transmit antenna T01.

In addition, when necessary, the transmission unit 109 adjusts a transmission timing (reception timing) of the transmission data related to D2D in accordance with the timing adjustment information related to D2D. The physical uplink shared channel in which uplink control data is arranged may include, for example, a layer 3 message (radio resource control message; RRC message) in addition to user data.

In FIG. 1, though other components of the terminal apparatus 1 and a transmission path of data (control information) between the components are omitted, it is apparent that a plurality of blocks having other functions necessary for operation as the terminal apparatus 1 are included as components. For example, a non-access stratum layer unit and an application layer unit, which carry out control with a core network, exist in a higher layer than that of the radio resource control unit 110.

Figure 2:
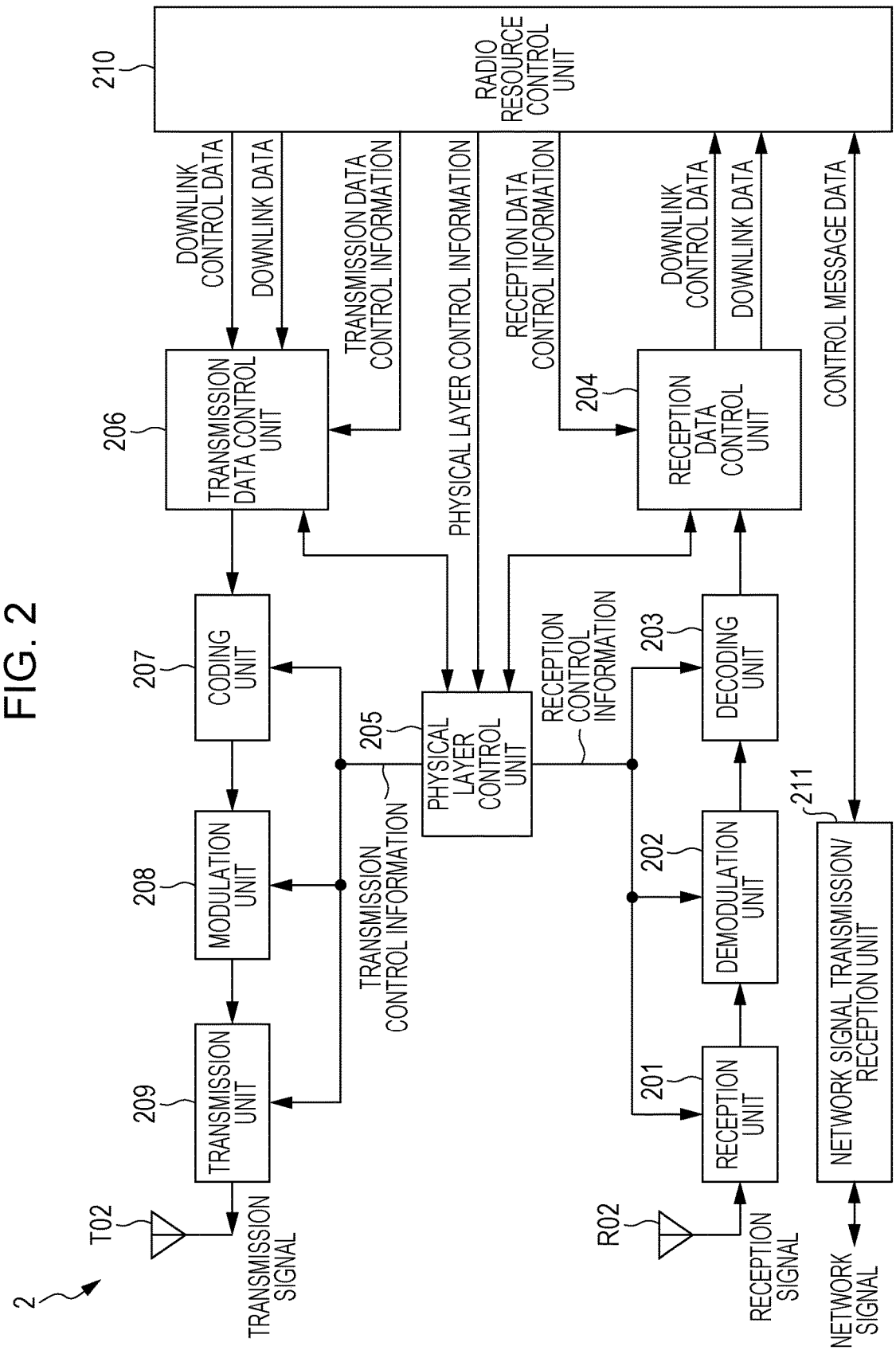
FIG. 2 is a block diagram illustrating an example of a schematic configuration of a base station apparatus according to the embodiment of the invention.

FIG. 2 is a block diagram illustrating an example of the base station apparatus 2 according to the first embodiment of the invention. The base station apparatus is composed of at least a reception unit 201, a demodulation unit 202, a decoding unit 203, a reception data control unit 204, a physical layer control unit 205, a transmission data control unit 206, a coding unit 207, a modulation unit 208, a transmission unit 209, a radio resource control unit 210, a network signal transmission/reception unit 211, a transmit antenna T02, and a receive antenna R02. The "unit" in the figure is an element which realizes functions and each procedure of the base station apparatus 2, which is represented also as a term of a section, a circuit, a configuration apparatus, a device, and the like.

The radio resource control unit 210 executes each function of an RRC (Radio Resource Control) layer which carries out radio resource control of the base station apparatus 2. The reception data control unit 204 and the transmission data control unit 206 execute each function in a MAC (Medium Access Control) layer, an RLC (Radio Link Control) layer, and a PDCP (Packet Data Convergence Protocol) layer which manage a data link layer.

Note that, in order to support transmission/reception processing of a plurality of frequencies (frequency bands, frequency bandwidths) or in the same subframe of a cell through carrier aggregation or the like, the base station apparatus 2 may have a configuration including a plurality of sets each of which is formed by a part or whole of reception-based blocks (the reception unit 201, the demodulation unit 202, the decoding unit 203, and the receive antenna R02), a plurality of frequencies (frequency bands, frequency bandwidths), and transmission-based blocks (the coding unit 207, the modulation unit 208, the transmission unit 209, and the transmit antenna R02).

The radio resource control unit 210 inputs downlink data and downlink control data to the transmission data control unit 206. When there is a MAC control element to be transmitted to the terminal apparatus 1, the transmission data control unit 206 inputs the MAC control element and each data (downlink data or downlink control data) to the coding unit 207. The coding unit 207 codes the MAC control element and each data, which are input, and inputs the resultant to the modulation unit 208. The modulation unit 208 performs modulation of a coded signal.

The signal modulated by the modulation unit 208 is input to the transmission unit 209. After mapping the input signal into a frequency domain, the transmission unit 209 converts the signal of the frequency domain into a signal of a time domain, performs power amplification by carrying it on a carrier wave of a given frequency, and transmits the signal via the transmit antenna T02. A physical downlink shared channel in which the downlink control data is arranged typically configures a layer 3 message (RRC message).

The reception unit 201 converts a signal, which is received from the terminal apparatus 1 via the receive antenna R02, into a base-band digital signal. When cells of a plurality of different transmission timings are configured to the terminal apparatus 1, the reception unit 201 receives a signal at different timings for each cell (or for each cell group, for each TA group). The digital signal converted at the reception unit 201 is input to the demodulation unit 202 and demodulated. The signal demodulated at the demodulation unit 202 is subsequently input to the decoding unit 203.

The decoding unit 203 decodes the input signal and inputs each decoded data (uplink data and uplink control data) to the reception data control unit 204. The MAC control element which is transmitted from the terminal apparatus 1 with each data is also decoded at the decoding unit 203, and related data is input to the reception data control unit 204.

The reception data control unit 204 performs control of the physical layer control unit 205 (for example, control related to a power headroom report, control related to a buffer status report, etc.) based on the received MAC control element, buffering of each decoded data, and error correction control (HARQ) for retransmitted data. Each data input to the reception data control unit 204 is input (transferred) to the radio resource control unit 210 as necessary.

In addition, when the buffer status report from the terminal apparatus 1 is input from the decoding unit 203, the reception data control unit 204 discriminate between a transmission resource request for communication with the base station apparatus itself and a transmission resource request for device-to-device data communication, and configures a transmission resource to be allocated to the terminal apparatus 1.

Physical layer control information needed for control of each of the blocks is information including parameter configuration needed for radio communication control of the base station apparatus 2, which is composed of reception control information and transmission control information. The physical layer control information is configured by a higher network apparatus (MME, a gateway apparatus (SGW), OAM, or the like) or a system parameter, and input to the control unit 204 as necessary by the radio resource control unit 210.

The physical layer control unit 205 inputs the physical layer control information involved in transmission as the transmission control information to each of the blocks of the coding unit 207, the modulation unit 208, and the transmission unit 209, and appropriately inputs the physical layer control information involved in reception as the reception control information to each of the blocks of the reception unit 201, the demodulation unit 202 and the decoding unit 203.

Reception data control information includes control information about the uplink of the terminal apparatus 1, which corresponds to each of a MAC layer, an RLC layer, and a PDCP layer of the base station apparatus 2. Transmission data control information includes control information about the downlink of the terminal apparatus 1, which corresponds to each of the MAC layer, the RLC layer, and the PDCP layer of the base station apparatus 2. That is, the reception data control information and the transmission data control information are configured for each terminal apparatus 1.

The network signal transmission/reception unit 211 performs transmission (transfer) or reception of a control message or user data between the base station apparatuses 2 or between a higher network apparatus (MME, SGW) and the base station apparatus 2. In FIG. 2, though other components of the base station apparatus 2 and a transmission path of data (control information) between the components are omitted, it is apparent that a plurality of blocks having other functions necessary for operation as the base station apparatus 2 are included as components. For example, a radio resource management unit and an application layer unit exist on top of the radio resource control unit 210.

Figure 3:
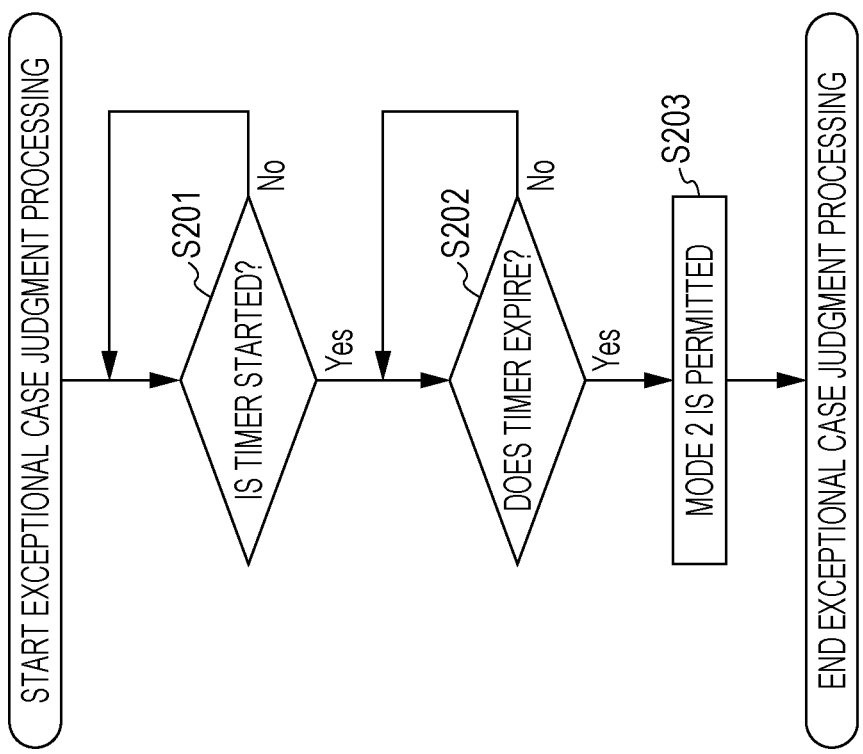
FIG. 3 is a flowchart illustrating an example of procedure related to mode selection of D2D of the terminal apparatus according to the embodiment of the invention.

FIG. 3 is a view illustrating an example of procedure in a case where the terminal apparatus 1 that is performing D2D communication in Mode 1 tries to perform D2D communication in Mode 2 exceptionally (exceptional case).

The procedure of FIG. 3 is started in the terminal apparatus 1 in the connected mode. When transmission data related to D2D is invoked, in other words, when the ProSe BSR is triggered, and/or when the base station apparatus 2 supports the D2D communication in Mode 2, and/or when the base station apparatus 2 notifies, to the terminal apparatus 1 in the connected mode, that the D2D communication in Mode 2 is exceptionally permitted, the procedure in FIG. 3 may be started.

The terminal apparatus 1 uses a timer for a certain time length (the certain number of subframes) to determine whether or not the D2D communication (in Mode 2) using a radio resource selected by the terminal apparatus 1 is able to be performed exceptionally. The terminal apparatus 1 determines (judges), for each subframe, whether or not predetermined conditions for starting the timer are met (step S201). At step S201, the terminal apparatus 1 performs determination on the basis of any one of conditions related to a buffer status report (that is, transmission data related to D2D which is invoked or which is provided from a higher layer), which will be described below, or a combination of a plurality of conditions.

The terminal apparatus 1 continues processing of step S201 when the predetermined conditions are not met (No at step S201). On the other hand, the terminal apparatus 1 starts (or restarts) the timer when the predetermined conditions are met (Yes at step S201). In a case where the timer is started, the terminal apparatus 1 determines, for each subframe, whether or not the timer expires (step S202). When an elapsed time (the number of subframes) from the start of the timer is equal to or more than a certain period, the terminal apparatus 1 determines that the timer expires. In a case where the timer does not expire (No at step S202), that is, in a case where the timer is counting (running), the terminal apparatus 1 continues processing of step S202.

When the timer expires (Yes at step S202), the terminal apparatus 1 may determine that the D2D communication in Mode 2 is exceptionally (temporarily) permitted in addition to Mode 1. Alternatively, the terminal apparatus 1 may determine that the D2D communication in Mode 1 is prohibited while the D2D communication in Mode 2 is exceptionally (temporarily) permitted or able to be used. When switching (changing, shifting) the D2D communication to Mode 2, in other words, when changing a selecting method of a radio resource related to D2D communication, the terminal apparatus 1 may cancel the MAC PDU including the ProSe BSR MAC-CE or may flush an HARQ buffer of corresponding HARQ process.

As a first method of starting the timer in FIG. 3, an example of a case where a trigger of the ProSe BSR is used as a condition will be described below.

When the ProSe BSR is triggered, the terminal apparatus 1 may use a new timer (referred to as a first Mode 2 timer) as a timer with which whether the radio resource of Mode 2 is able to be used is determined. In the case where the ProSe BSR is triggered, the terminal apparatus 1 may start counting of the first Mode 2 timer as the timer with which whether the radio resource of Mode 2 is able to be used is determined. The terminal apparatus 1 may use any of trigger conditions of a normal BSR as a condition by which the ProSe BSR is triggered. The base station apparatus 2 is able to notify the terminal apparatus 1 of a value (period) of the first Mode 2 timer by using an individual RRC message and/or system information. Alternatively, the terminal apparatus 1 is also able to decide the value of the first Mode 2 timer on the basis of pre-configuration by a UICC or static configuration in a system.

Moreover, the base station apparatus 2 may notify the terminal apparatus 1 of only an indication for permitting the use of the first method.

When the first Mode 2 timer expires, the terminal apparatus 1 may determine that the D2D communication in Mode 2 is able to be used exceptionally (temporarily). In addition, when the D2D communication in Mode 2 is performed exceptionally or when the first Mode 2 timer expires, the terminal apparatus 1 may continue procedure of retransmitting the triggered ProSe BSR or may cancel the triggered ProSe BSR. Further, in a state of performing the D2D communication in Mode 2 exceptionally, the terminal apparatus 1 may regard the ProSe BSR as zero (that is, report the ProSe BSR as zero), or may operate so that the ProSe BSR is not triggered.

The terminal apparatus 1 may start counting of the first Mode 2 timer as the timer with which whether the radio resource of Mode 2 is able to be used is determined, only in a case where a ProSe BSR corresponding to a regular BSR is triggered. That is, the terminal apparatus 1 may use, as an additional or alternative condition, a case where uplink data for D2D capable of being transmitted is generated in a higher layer (RLC layer, PDCP layer) and, furthermore, a degree of priority of a logical channel related to the uplink data for D2D is higher than a degree of priority of data in a transmission buffer or there is no other uplink data capable of being transmitted.

In a case of having received D2D grant from the base station apparatus 2, the terminal apparatus 1 may stop or restart the first Mode 2 timer. In a case of having received (not the D2D grant but) uplink grant from the base station apparatus 2, the terminal apparatus 1 may not stop the first Mode 2 timer and continue counting as it is.

Moreover, as a second method of starting the timer in FIG. 3, an example of a case where allocation of an uplink radio resource in a state where the ProSe BSR is triggered is used for a condition will be described below.

The terminal apparatus 1 uses, as a condition of starting the timer, whether or not the allocation of the uplink radio resource in the state where the ProSe BSR is triggered is performed. That is, in a case where at least one ProSe BSR is triggered in the MAC layer of the terminal apparatus 1 and, furthermore, the ProSe BSR is not canceled, when uplink radio resource allocation for new transmission is notified in a certain subframe, the terminal apparatus 1 may start counting of the timer with which whether the radio resource of Mode 2 is able to be used is determined.

At this time, the terminal apparatus 1 may use a retransmission timer related to ProSe BSR as the timer with which whether the radio resource of Mode 2 is able to be used is determined. The terminal apparatus 1 may start counting of the retransmission timer related to ProSe BSR as the timer with which whether the radio resource of Mode 2 is able to be used is determined, in a case where an uplink radio resource capable of notifying the ProSe BSR is allocated. The retransmission timer related to ProSe BSR may be the same retransmission timer as that of a normal BSR (retx-BSR-Timer) or may be a different retransmission timer (for example, retxProSeBSR-Timer).

Furthermore, the base station apparatus 2 may notify the terminal apparatus 1 of only an indication for permitting the use of the second method.

When the retransmission timer related to ProSe BSR expires, the terminal apparatus 1 may determine that the D2D communication in Mode 2 is able to be used exceptionally (temporarily). Additionally, in a case where the D2D communication in Mode 2 is exceptionally performed, or in a case where the retransmission timer related to ProSe BSR is used as the timer, with which whether the radio resource of Mode 2 is able to be used is determined, and the retransmission timer expires, the terminal apparatus 1 may continue the procedure of retransmitting the ProSe BSR or may cancel the triggered ProSe BSR. Further, in the state of performing the D2D communication in Mode 2 exceptionally, the terminal apparatus 1 may regard the ProSe BSR as zero (that is, report the ProSe BSR as zero), or may operate so that the ProSe BSR is not triggered.

The terminal apparatus 1 may use the retransmission timer related to ProSe BSR as the timer with which whether the radio resource of Mode 2 is able to be used is determined, only in a case where a ProSe BSR corresponding to a regular BSR is triggered. That is, the terminal apparatus 1 may use, as an additional or alternative condition, a case where uplink data for D2D capable of being transmitted is generated in a higher layer (RLC layer, PDCP layer) and, furthermore, a degree of priority of a logical channel related to the uplink data for D2D is higher than a degree of priority of data in a transmission buffer or there is no other uplink data capable of being transmitted.

In addition, the base station apparatus 2 may notify a counter value indicating the number of times of retransmission of the ProSe BSR instead of a timer value. The terminal apparatus 1 may use the counter value indicating the number of times of retransmission of the ProSe BSR instead of the timer value. In a case where the number of times of retransmission of the ProSe BSR reaches a certain first value, the terminal apparatus 1 may determine that the D2D communication in Mode 2 is exceptionally permitted.

Moreover, the base station apparatus 2 may notify, instead of the timer value, a counter value indicating the number of times of HARQ retransmission of the MAC PDU which includes the ProSe BSR MAC-CE. The terminal apparatus 1 may use, instead of the timer value, the counter value indicating the number of times of HARQ retransmission of the MAC PDU which includes the ProSe BSR MAC-CE. When the number of times of HARQ retransmission of the MAC PDU which includes the ProSe BSR MAC-CE reaches a certain first value, the terminal apparatus 1 may determine that the D2D communication in Mode 2 is exceptionally permitted. The terminal apparatus 1 may use, for example, the maximum number of times of HARQ transmission (maxHARQ-Tx), which is notified by the RRC layer, as the first value.

Alternatively, the terminal apparatus 1 may use a new timer (referred to as a second Mode 2 timer) as a timer with which whether the radio resource of Mode 2 is able to be used is determined. In a case of having received D2D grant from the base station apparatus 2, the terminal apparatus 1 may stop or restart the second Mode 2 timer. In a case of having received (not the D2D grant but) uplink grant from the base station apparatus 2, the terminal apparatus 1 may not stop the second Mode 2 timer and continue counting as it is.

Additionally, the second Mode 2 timer may be configured by using an offset value for the retransmission timer related to ProSe BSR. For example, in a case where a value indicating "m" subframes (m is an integer) is notified as the offset value, a time (the number of subframes) obtained by subtracting "m" subframes from a timer value (the number of subframes) of the retransmission timer related to ProSe BSR may be considered as the second Mode 2 timer. The offset value may be a positive number or a negative number. In addition, the second Mode 2 timer may be configured by using a coefficient for the retransmission timer related to ProSe BSR. For example, when a coefficient indicating "one half" is notified, a time (the number of subframes) obtained by multiplying the timer value (the number of subframes) of the retransmission timer related to ProSe BSR by "one half" may be considered as the second Mode 2 timer.

Moreover, as a third method of starting the timer in FIG. 3, an example of a case where an SR which requests a radio resource for transmitting the ProSe BSR (referred to as D2D-SR) is used as a condition will be described below.

The terminal apparatus 1 uses, as a condition for starting the timer, whether or not an SR is triggered to request a radio resource used for transmitting the ProSe BSR when an uplink resource capable of notifying the ProSe BSR is not allocated. That is, in a case where at least one D2D-SR is triggered to transmit the ProSe BSR in the MAC layer of the terminal apparatus 1 and the D2D-SR is not canceled and in a case where there is uplink radio resource allocation for new transmission in a certain subframe, the terminal apparatus 1 may start counting of the timer with which whether the radio resource of Mode 2 is able to be used is determined. Note that, in a case where an SR for transmitting (not D2D but) normal data is triggered, the terminal apparatus 1 may determine that the conditions for starting the timer are not met.

Additionally, in a case where the ProSe BSR corresponding to a regular BSR is triggered and an uplink radio resource allocation for new transmission is not performed (not received, not configured) in a certain subframe, the terminal apparatus 1 may use the timer with which whether the radio resource of Mode 2 is able to be used is determined.

The terminal apparatus 1 may use a new timer (referred to as a third Mode 2 timer) as the timer with which whether the radio resource of Mode 2 is able to be used is determined. In a case where the SR is triggered under the above-described conditions, the terminal apparatus 1 may start counting of the third Mode 2 timer. The base station apparatus 2 is able to notify the terminal apparatus 1 of a value of the third Mode 2 timer by using an individual RRC message and/or system information. Alternatively, the terminal apparatus 1 is able to decide the value of the third Mode 2 timer on the basis of pre-configuration by a UICC or static configuration in a system.

Moreover, the base station apparatus 2 may notify the terminal apparatus 1 of only an indication in which the third method is permitted to use.

When the third Mode 2 timer expires, the terminal apparatus 1 may determine that the D2D communication in Mode 2 is able to be used exceptionally (temporarily). Additionally, in a case where the D2D communication in Mode 2 is exceptionally performed or in a case where the third Mode 2 timer expires, the terminal apparatus 1 may continue the procedure of retransmitting the triggered ProSe BSR, cancel the triggered ProSe BSR, or cancel the pended D2D-SR. Further, in the state of performing the D2D communication in Mode 2 exceptionally, the terminal apparatus 1 may regard the ProSe BSR as zero (that is, report the ProSe BSR as zero), or may operate so that the ProSe BSR is not triggered.

Note that, the base station apparatus 2 may notify a counter value indicating the number of times of retransmission of the D2D-SR instead of a timer value. The terminal apparatus 1 may use the counter value indicating the number of times of retransmission of the D2D-SR instead of the timer value. In a case where the number of times of retransmission of the D2D-SR reaches a certain first value, the terminal apparatus 1 may determine that the D2D communication in Mode 2 is exceptionally permitted.

In a case of having received uplink grant or D2D grant from the base station apparatus 2, the terminal apparatus 1 may stop or restart the third Mode 2 timer. In the case of having received the uplink grant from the base station apparatus 2, the terminal apparatus 1 may not stop the third Mode 2 timer and continue counting as it is.

The terminal apparatus 1 supports any one of the above-described timers, each of which is started when the condition is met, or a combination of a plurality of conditions. In the case of supporting the combination of the plurality of conditions, the terminal apparatus 1 is able to perform counting of the plurality of timers in parallel.

In this case, information of the timer which is started when the above-described condition is met may be configured for (notified to) each group index included in the ProSe BSR. That is, a plurality of different timer values may be configured for (notified to) each group index. With respect to the terminal apparatus 1, the base station apparatus 2 may configure an individual timer value for each group index, or may configure a common timer value for some group indexes. The terminal apparatus 1 may configure an individual timer value for each group index on the basis of priority determined (decided) by the terminal apparatus 1. The terminal apparatus 1 manages an operation (start, restart, stop, expiry, and the like) of the timer for each group index independently.

For example, the first Mode 2 timer may be configured for each group index. Moreover, the retransmission timer related to ProSe BSR (retxProSeBSR-Timer) may be configured for each group index. Additionally, the second Mode 2 timer may be configured for each group index. Furthermore, the third Mode 2 timer may be configured for each group index.

The terminal apparatus 1 may notify the base station apparatus 2 of information such as priority of a group (group index) determined (decided) by the terminal apparatus 1, a type (attribute) of a group corresponding to a group index, or a timer value of a group index for each group index. As an information element related to D2D, such information may be notified with an individual RRC message, may be notified with system information, or may be configured with use of a UICC in advance, or a pre-determined value may be used therefor. Examples of the type of a group corresponding to a group index include, for example, pieces of information which are classified in accordance with importance or a type of communication such as public safety communication, mission-critical communication, or business correspondence, or index information corresponding to the classification.

The base station apparatus 2 may configure (notify) the radio resource of Mode 2, which is exceptionally selected, as a radio resource which is independent of a radio resource of Mode 2 of system information, an individual RRC message, or pre-configuration with use of a UICC, or configure (notify) it as a radio resource a part or the whole of which is common thereto.

The base station apparatus 2 may notify (designate, instruct, configure), for each group index, whether or not the radio resource of Mode 2 is able to be used exceptionally. Alternatively, the terminal apparatus 1 may determine (judge), for each group index, whether or not the radio resource of Mode 2 is able to be used exceptionally. Notification of a timer value for a group index as zero or infinity may implicitly mean that, in the group index, determination as to whether the radio resource of Mode 2 is able to be used is not made on the basis of the timer. Moreover, by not configuring a timer value for a group index, it may be possible to implicitly mean that, in the group index, determination as to whether the radio resource of Mode 2 is able to be used is not made on the basis of the timer.

Additionally, the terminal apparatus 1 may determine whether or not the radio resource of Mode 2 is able to be used, on the basis of a degree of priority of short-range group communication to which the terminal apparatus 1 belongs. The base station apparatus 2 may notify the terminal apparatus 1 of information indicating that the radio resource of Mode 2 is able to be used only for short-range group communication having a certain degree of priority (or equal to or more than a certain degree of priority). For example, the base station apparatus 2 may notify information indicating that the radio resource of Mode 2 is able to be used exceptionally only for a group whose degree of priority is High. Whether or not the degree of priority is High may be determined by the terminal apparatus 1, or may be determined for each group index and notified to the terminal apparatus 1 by the base station apparatus 2. Alternatively, the base station apparatus 2 may notify information indicating that the radio resource of Mode 2 is able to be used exceptionally only for a group whose degree of priority is Low and/or Normal.

As an information element related to D2D, the information (configuration) indicating whether or not the radio resource of Mode 2 is able to be used exceptionally may be notified with an individual RRC message, may be notified with system information, may be configured with use of a UICC in advance, or may be based on pre-determined configuration (system parameter).

Note that, only one piece of information of the above-described timers, each of which is started when the condition is met, may be configured for (notified to) the terminal apparatus 1 regardless of a group index. The information of the above-described timers each of which starts in the case where the condition is met may be configured for (notified to) a plurality of terminal apparatuses 1 commonly and/or for each group with system information regardless of a group index.

In a case where any one of the above-described timers expires, that is, in a case where any of the timers indicating that the radio resource of Mode 2 is able to be used exceptionally expires, the terminal apparatus 1 may activate a timer (referred to as a Mode 1 prohibiting timer) which prohibits (suppresses, regulates) a request of a radio resource for the D2D communication to the base station apparatus 2 (that is, Mode 1). With this timer, the terminal apparatus 1 is able to prevent frequent changes of modes. The base station apparatus 2 is able to notify the terminal apparatus 1 of a value of the Mode 1 prohibiting timer by using an individual RRC message and/or system information. Alternatively, the terminal apparatus 1 is also able to decide the value of the Mode 1 prohibiting timer on the basis of pre-configuration with use of a UICC or static configuration in a system. In a case where the Mode 1 prohibiting timer is not notified, the terminal apparatus 1 may use a default value or may not start the Mode 1 prohibiting timer.

When the Mode 1 prohibiting timer is counting, the terminal apparatus 1 may operate so as not to trigger the ProSe BSR or not to trigger an SR related to D2D communication (D2D-SR). When the Mode 1 prohibiting timer is counting, the terminal apparatus 1 may operate so as to trigger a normal BSR (first buffer status report) or a normal SR related to uplink data.

In a case where a plurality of group indexes are included in one ProSe BSR, or in a case where a ProSe BSR related to a plurality of group indexes is triggered, the terminal apparatus 1 may start a plurality of timers simultaneously, or may select and start one of them. The terminal apparatus 1 may make a selection on the basis of a degree of priority, may make a selection on the basis of notification from the base station apparatus 2, may make a selection on the basis of a length (shortness) of a value of a timer to be adopted, may make a selection on the basis of a maximum value (minimum value) of the group indexes, may make a selection randomly, or may make a selection on the basis of other criteria.

Figure 4:
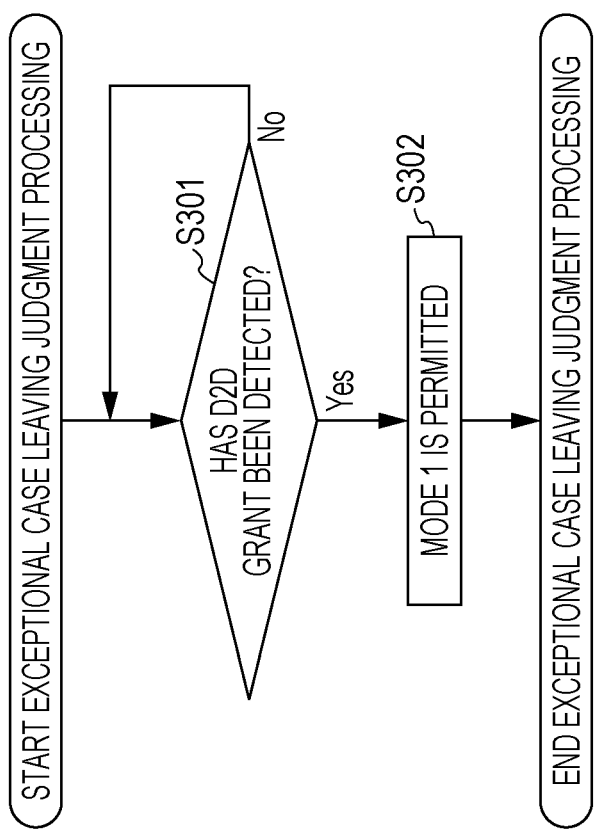
FIG. 4 is a flowchart illustrating an example of procedure, in which the terminal apparatus leaves an exceptional state, according to the embodiment of the invention.

FIG. 4 is a flowchart illustrating an example of a case where the terminal apparatus 1 which satisfies the above-described condition and thereby exceptionally performs the D2D communication in Mode 2 leaves the exceptional state and performs D2D communication in Mode 1. The flowchart in FIG. 4 is able to be applied to the first method, the second method, and the third method of starting the timer in FIG. 3.

Procedure in FIG. 4 is started in a state where the terminal apparatus 1 exceptionally operates in Mode 2. The terminal apparatus 1 receives a PDCCH of the base station apparatus 2 and tries to detect (receive) D2D grant for the terminal apparatus 1 (step S301). When having detected (received) the D2D grant from the base station apparatus 2 (Yes at step S301), the terminal apparatus 1 judges that a state where the D2D communication in Mode 1 is permitted (a state where the D2D communication in Mode 2 is not performed, or a state where the radio resource of Mode 2 is not used) is restored from the state where the D2D communication in Mode 2 is exceptionally permitted (step S302). When having failed to detect (receive) the D2D grant from the base station apparatus 2 (No at step S301), the terminal apparatus 1 continues processing of detecting (receiving) the D2D grant for the terminal apparatus 1.

Figure 5:
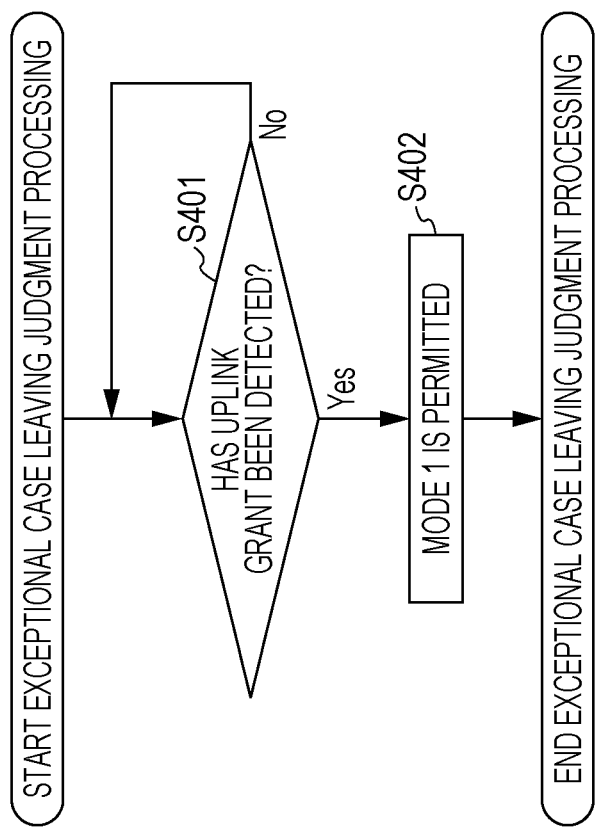
FIG. 5 is a flowchart illustrating another example of procedure, in which the terminal apparatus leaves an exceptional state, according to the embodiment of the invention.

FIG. 5 is another flowchart illustrating an example of the case where the terminal apparatus 1 which satisfies the above-described condition and thereby exceptionally performs the D2D communication in Mode 2 leaves the exceptional state and performs the D2D communication in Mode 1. The flowchart in FIG. 5 is able to be applied to the third method of starting the timer in FIG. 3.

Procedure in FIG. 5 is started in the state where the terminal apparatus 1 exceptionally operates in Mode 2. The terminal apparatus 1 receives a PDCCH of the base station apparatus 2, and tries to detect (receive) uplink grant for the terminal apparatus 1 (step S401). When having detected (received) the uplink grant from the base station apparatus 2 (Yes at step S401), the terminal apparatus 1 judges that the state where the D2D communication in Mode 1 is permitted (the state where the D2D communication in Mode 2 is not performed, or the state where the radio resource of Mode 2 is not used) is restored from the state where the D2D communication in Mode 2 is exceptionally permitted (step S402). When having failed to detect (receive) the uplink grant from the base station apparatus 2 (No at step S401), the terminal apparatus 1 continues processing of detecting (receiving) the D2D grant for the terminal apparatus 1.

Note that, a logical channel group ID (LCGID) is able to be used instead of a group index. In this case, with respect to the terminal apparatus 1, the base station apparatus 2 may configure an individual timer value for each LCGID. The terminal apparatus 1 may configure an individual timer value for each LCGID on the basis of priority determined by the terminal apparatus 1. The terminal apparatus 1 manages an operation (start, restart, stop, expiry, and the like) of the timer for each LCGID independently.

With such a configuration, when the terminal apparatus 1 fails to start D2D communication with use of a radio resource allocated by the base station apparatus 2 (Mode 1) within a certain predetermined time, the terminal apparatus 1 and the base station apparatus 2 are able to switch the mode to D2D communication with use of a radio resource selected by the terminal apparatus 1 (Mode 2), so that interruption time of D2D services is reduced, thus making it possible to guarantee robustness of D2D communication.

Additionally, the terminal apparatus 1 is able to configure each timer, which is to be used for determination of mode switching, on the basis of short-range group communication to which the terminal apparatus 1 belongs, and start it. Moreover, on the basis of the short-range group communication to which the terminal apparatus 1 belongs, the terminal apparatus 1 is able to determine whether or not to switch the mode. Further, the base station apparatus 2 is able to notify the terminal apparatus 1 of information of the timer, which is to be used for switching the mode, for each short-range group communication to which the terminal apparatus 1 belongs.

According to the first embodiment, in the case of being interested in D2D, the terminal apparatus 1 is able to efficiently switch the mode of D2D communication on the basis of the timer, which is activated on the basis of one or more conditions related to a buffer status report, and group information of short-range group communication to which the terminal apparatus 1 belongs, so that it is possible to efficiently perform communication related to D2D. Additionally, the base station apparatus 2 is able to notify the terminal apparatus 1 of information of a timer based on the group information of the short-range group communication to which the terminal apparatus 1 belongs, so that it is possible to cause the communication related to D2D of the terminal apparatus 1 to be efficiently performed.

<Second Embodiment>

A second embodiment of the invention will be described below.

An example in which the timer with which whether or not the radio resource of Mode 2 is able to be used exceptionally is determined is configured for each group index has been described in the first embodiment. However, in a case where the radio resource of Mode 2 is used in the first embodiment, all communication related to D2D is performed in Mode 2. Then, a method which enables mode switching in a unit of short-range group communication (that is, a unit of a group index, or a unit of a group ID) will be described in a second embodiment.

Since configurations of the terminal apparatus 1 and the base station apparatus 2 of the second embodiment may be the same as those of the first embodiment, description thereof will be omitted.

In a case where any of the conditions described in the first embodiment is met, the terminal apparatus 1 starts a timer corresponding to a group index (a Mode 2 timer, and/or the retransmission timer related to ProSe BSR). When the timer expires, communication (short-range group communication) of a group ID mapped onto the group index may be performed in Mode 2, and D2D communication related to other group IDs (group indexes) may be performed in Mode 1.

Note that, a group (group index) which performs the D2D communication in Mode 2 may be notified from the base station apparatus 2. The base station apparatus 2 is able to notify the terminal apparatus 1 of the group, which performs the D2D communication in Mode 2, by using an individual RRC message and/or system information. Alternatively, the terminal apparatus 1 is also able to decide the group, which performs the D2D communication in Mode 2, on the basis of pre-configuration with use of a UICC or static configuration in a system.

In a case where the timer corresponding to the group index expires, and the group index corresponds to the group which performs the D2D communication in Mode 2, the terminal apparatus 1 may cancel a corresponding ProSe BSR.

The base station apparatus 2 may prepare a radio resource of Mode 2, which is selected in a case where the D2D communication in Mode 2 is exceptionally performed, for each group (group index). The base station apparatus 2 may configure (notify) the radio resource of Mode 2, which is exceptionally selected, as a radio resource which is independent of a radio resource of Mode 2 of system information, an individual RRC message, or a pre-configuration with use of a UICC, or configure (notify) it as a radio resource a part or the whole of which is common thereto.

The base station apparatus 2 may notify the terminal apparatus 1 of information which indicates mapping between the radio resource of Mode 2 and the group index, or information which indicates mapping between the radio resource of Mode 2 and information indicating priority of short-range group communication. In the case of exceptionally performing the D2D communication in Mode 2, the terminal apparatus 1 may select the radio resource of Mode 2 on the basis of the group ID, the group index, or the priority of the short-range group communication.

Similarly, the terminal apparatus 1 is also able to leave the exceptional state as to each group ID (group index) exceptionally performing the D2D communication in Mode 2.

The base station apparatus 2 may transmit D2D grant with the group index included therein. The terminal apparatus 1 may judge, for each group index, that the state where the D2D communication in Mode 1 is permitted (the state where the D2D communication in Mode 2 is not performed, or the state where the radio resource of Mode 2 is not used) is restored from the state where the D2D communication in Mode 2 is exceptionally permitted, on the basis of information of the group index included in the D2D grant.

Additionally, when detecting the D2D grant, the terminal apparatus 1 may judge, for each group index, that the state where the D2D communication in Mode 1 is permitted (the state where the D2D communication in Mode 2 is not performed, or the state where the radio resource of Mode 2 is not used) is restored from the state where the D2D communication in Mode 2 is exceptionally permitted, on the basis of priority of the group (group index) determined (decided) by the terminal apparatus 1, a type (attribute) of the group corresponding to the group index, or the like.

With such a configuration, when the terminal apparatus 1 fails to start D2D communication with use of a radio resource allocated by the base station apparatus 2 (Mode 1) within a certain predetermined time, the terminal apparatus 1 and the base station apparatus 2 are able to switch, for each group, the mode to D2D communication with use of a radio resource selected by the terminal apparatus 1 (Mode 2), so that interruption time of D2D services is reduced, thus making it possible to guarantee robustness of D2D communication.

Additionally, the terminal apparatus 1 is able to configure each timer, which is used for determination of mode switching, on the basis of short-range group communication to which the terminal apparatus 1 belongs, and start it. Moreover, on the basis of the short-range group communication to which the terminal apparatus 1 belongs, the terminal apparatus 1 is able to determine, for each group, whether or not to switch the mode. Further, the base station apparatus 2 is able to notify the terminal apparatus 1 of information of the timer used for the mode switching, for each short-range group communication to which the terminal apparatus 1 belongs.

According to the second embodiment, in addition to the first embodiment, the terminal apparatus 1 is able to efficiently switch a method of allocating a radio resource for D2D communication, for each short-range group communication to which the terminal apparatus 1 belongs, so that it is possible to efficiently perform communication related to D2D. Additionally, when allocating a radio resource of D2D, the base station apparatus 2 is able to perform notification with group information (group index) of the short-range group communication to which the terminal apparatus 1 belongs included, so that it is possible to cause communication related to D2D of the terminal apparatus 1 to be efficiently performed for each group.

Note that, the embodiments described above are only exemplifications, and may be realized by using various modified examples and substitution examples. For example, an uplink transmission scheme may be applied also to communication systems of both an FDD (frequency division duplex) scheme and a TDD (time division duplex) scheme. In addition, names of respective parameters and respective events, which are indicated in the embodiments, are given for convenience of description, and even when names in practical use and names of the embodiments of the invention are different, there is no influence on the gist of the invention which is claimed by the embodiments of the invention.

In addition, the timer with which whether the radio resource of Mode 2 is able to be used exceptionally is determined may be configured (notified) not for each group index but for each transmission source layer 2 ID (Source Layer2-ID) or for each transmission destination layer 2 ID (Destination Layer2-ID), for example.

"Connection" used in each of the embodiments does not suggest to be limited to a configuration in which a certain apparatus and a certain different apparatus are directly connected by using a physical line, and also includes a configuration of logical connection and a configuration of wireless connection by using wireless technologies.

Moreover, since transmission data related to D2D is received by using an uplink frequency in the terminal apparatus 1, when expression of "downlink" is used in each of the embodiments, it should be interpreted, as to D2D, as "reception of transmission data related to D2D from another terminal apparatus 1 using an uplink frequency (also referred to as D2D reception or D2D-Rx)". Similarly, when expression of "uplink" is used in each of the embodiments, it should be interpreted, as to D2D, as "transmission of transmission data related to D2D to another terminal apparatus 1 using an uplink frequency (also referred to as D2D transmission or D2D-Tx)".

The terminal apparatus, the base station apparatus, the communication system, the communication method, and the integrated circuit in each of the embodiments are able to be applied to general D2D communication, and more adaptable particularly to short-range group communication (group cast communication, ProSe Group Communication).

The terminal apparatus 1 includes apparatuses having a communication function, such as not only a portable or movable mobile station apparatus, but also stationary or unmovable electronic equipment which is installed indoors and outdoors such as, for example, AV equipment, kitchen equipment, a cleaning/washing machine, air conditioning equipment, office equipment, an automatic vending machine, other domestic equipment, measurement equipment, an in-vehicle apparatus, and further, wearable equipment which is wearable, or healthcare equipment. Further, the terminal apparatus 1 is used not only for person to person or person to equipment communication, but also for equipment to equipment communication (Machine Type Communication (MTC)).

The terminal apparatus 1 is also referred to as a user terminal, a mobile station apparatus, a communication terminal, a moving body, a terminal, UE (User Equipment), or an MS (Mobile Station). The base station apparatus 2 is also referred to as a radio base station apparatus, a base station, a radio base station, a fixed station, NB (NodeB), eNB (evolved NodeB), a BTS (Base Transceiver Station), or a BS (Base Station).

Note that, the base station apparatus 2 is referred to as NB in UMTS which is prescribed by the 3GPP, and as eNB in the EUTRA. Note that, the terminal apparatus 1 in the UMTS, which is prescribed by the 3GPP, and the EUTRA is referred to as UE.

Further, though steps of a method, means, or algorithm for realizing functions or a part of functions of each unit of the terminal apparatus 1 and the base station apparatus 2 have been described specifically in combination by using functional block diagrams for convenience of description, they may be embodied directly in hardware, in a software module executed by a processor, or in a combination thereof.

If being implemented in hardware, the terminal apparatus 1 and the base station apparatus 2 are configured by a feeding apparatus or a battery for supplying power to the terminal apparatus 1 and the base station apparatus 2, a display apparatus of a liquid crystal or the like and a display drive apparatus, a memory, an input/output interface and an input/output terminal, a speaker, or other peripheral apparatuses, in addition to the described configuration of the block diagram.

If being implemented in software, the function may be held or transmitted as one or more commands or codes on a computer readable medium. The computer readable media include both communication media and computer recording media including a medium that facilitates transferring a computer program from one place to another place.

Then, control of the terminal apparatus 1 and the base station apparatus 2 may be performed by recording one or more commands or codes in a computer readable recording medium and causing a computer system to read the one or more commands or codes recorded in this recording medium for execution. Note that, the "computer system" here is set to include an OS and hardware such as peripheral equipment.

Operations described in each of the embodiments of the invention may be realized by a program. The program which is operated at the terminal apparatus 1 and the base station apparatus 2 related to each of the embodiments of the invention is a program (program causing a computer to function) which controls a CPU or the like so as to realize the functions of the embodiments related to each of the embodiments of the invention. In addition, information handled in these apparatuses is temporarily accumulated in a RAM during processing thereof, and then stored in various ROMs or HDDs to be read out by the CPU, as necessary, for correction and writing.

In addition, although the functions of the embodiments described above are realized by executing the program, the functions of each of the embodiments of the invention are also realized in some cases by performing processing on the basis of instructions of the program in conjunction with an operating system, other application programs, or the like.

Moreover, the "computer readable recording medium" refers to a portable medium such as a semiconductor medium (for example, such as a RAM or a nonvolatile memory card), an optical recording medium (for example, such as a DVD, an MO, an MD, a CD or a BD), a magnetic recording medium (for example, such as a magnetic tape or a flexible disk), or a storage apparatus including a disc unit embedded in a computer system. Further, the "computer readable recording medium" includes one which dynamically holds a program for a short time, such as a communication line in a case where the program is transmitted through a network such as the Internet or a communication line such as a telephone line, and one which holds a program for a fixed time, such as a volatile memory inside a computer system serving as a server or a client in the above case.

The aforementioned program may be one for realizing a part of the functions described above, and further may be one capable of realizing the functions described above by being combined with a program which has been already recorded in a computer system.

Each functional block or various features of the terminal apparatus 1 and the base station apparatus 2 used in each of the embodiments may be implemented or executed by a general-purpose processor, a digital signal processor (DSP), an application specific integrated circuit (ASIC) or any general application integrated circuit (IC), a field programmable gate array signal (FPGA) or other programmable logic devices, discrete gates or transistor logic, or a discrete hardware component, which is designed to exhibit at least the functions described in the present specification, or a combination thereof.

The general-purpose processor may be a microprocessor, or, alternatively, the processor may be a conventional processor, a controller, a microcontroller, or a state machine. The general-purpose processor or each circuit described above may be configured by a digital circuit or may be configured by an analogue circuit, or may include the both.

The processor may be implemented also as a combination with a computing device. For example, a DSP and a microprocessor, a plurality of microprocessors, one or more microprocessors connected to a DSP core, or other such configurations may be combined.

As above, the embodiments of the invention have been described in detail on the basis of specific examples, however, it is clear that a gist of each embodiment and a scope of Claims of the invention are not limited to these specific examples, and design change, and the like which are not departed from the gist of the invention are also included. That is, the description in the present specification aims to give exemplary description and does not give any limitation to each embodiment of the invention.

The invention can be modified in various manners within the scope defined by the Claims, and embodiments obtained by appropriately combining technical means disclosed in different embodiments are also encompassed by the technical scope of the invention. A configuration in which elements described in each of the embodiments and achieving similar effects are replaced with each other is also encompassed in the technical scope of the invention.

REFERENCE SIGNS LIST 1 terminal apparatus
2 base station apparatus
101, 201 reception unit
102, 202 demodulation unit
103, 203 decoding unit
104, 204 reception data control unit
105, 205 physical layer control unit
106, 206 transmission data control unit
107, 207 coding unit
108, 208 modulation unit
109, 209 transmission unit
110, 210 radio resource control unit
211 network signal transmission/reception unit
T01, T02 transmit antenna
R01, R02 receive antenna

The invention claimed is:

1. A terminal apparatus capable of direct communication with another terminal apparatus, the terminal apparatus comprising:

a processor; and a memory, wherein the terminal apparatus performs direct communication with the another terminal apparatus and supports (i) a first radio resource allocation method, by which a radio resource to be used for the direct communication is scheduled by a base station apparatus, and (ii) a second radio resource allocation method, by which the terminal apparatus autonomously selects a radio resource to be used for the direct communication from allocated radio resources, the memory stores instructions that cause the processor to:

receive information of a timer used to determine that the second radio resource allocation method, instead of the first radio resource allocation method, is to be used, and perform the direct communication with use of a specific radio resource allocation method, the specific radio resource allocation method is changed from the first radio resource allocation method into the second radio resource allocation method based on whether or not the timer is running, and the information indicates an integer value for the timer.

2. A base station apparatus that performs communication with a terminal apparatus supporting direct communication with another terminal apparatus, the base station apparatus comprising:

a processor; and a memory, wherein the terminal apparatus performs direct communication with the another terminal apparatus and supports (i) a first radio resource allocation method, by which a radio resource to be used for the direct communication is scheduled by the base station apparatus, and (ii) a second radio resource allocation method, by which the terminal apparatus autonomously selects a radio resource to be used for the direct communication from allocated radio resources, wherein the memory stores instructions that cause the processor to:

configure information of a timer used to determine that the second radio resource allocation method, instead of the first radio resource allocation method, is to be used, and transmit the information, and the direct communication is performed with use of a specific radio resource allocation method, the specific radio resource allocation method is changed from the first radio resource allocation method into the second radio resource allocation method based on whether or not the timer is running, and the information indicates an integer value for the timer.

3. A communication method for use in a terminal apparatus capable of direct communication with another terminal apparatus, the terminal apparatus performs direct communication with the another terminal apparatus and supports (i) a first radio resource allocation method, by which a radio resource to be used for the direct communication is scheduled by a base station apparatus, and (ii) a second radio resource allocation method, by which the terminal apparatus autonomously selects a radio resource to be used for the direct communication from allocated radio resources, wherein the communication method comprises at least:

receiving information of a timer used to determine that the second radio resource allocation method, instead of the first radio resource allocation method, is to be used, and performing the direct communication with use of a specific radio resource allocation method, the specific radio resource allocation method is changed from the first radio resource allocation method into the second radio resource allocation method based on whether or not the timer is running, and the information indicates an integer value for the timer.

4. A communication method for use in a base station apparatus that performs communication with a terminal apparatus supporting direct communication with another terminal apparatus, the terminal apparatus performs direct communication with the another terminal apparatus and supports (i) a first radio resource allocation method, by which a radio resource to be used for the direct communication is scheduled by the base station apparatus, and (ii) a second radio resource allocation method, by which the terminal apparatus autonomously selects a radio resource to be used for the direct communication from allocated radio resources, wherein the communication method comprises at least:

configuring information of a timer used to determine that the second radio resource allocation method, instead of the first radio resource allocation method, is to be used, and transmitting the information, and the direct communication is performed with use of a specific radio resource allocation, the specific radio resource allocation method is changed from the first radio resource allocation method into the second radio resource allocation method based on whether or not the timer is running, and the information indicates an integer value for the timer.

* * * * *